US011525746B2

(12) United States Patent
Bok et al.

(10) Patent No.: US 11,525,746 B2
(45) Date of Patent: Dec. 13, 2022

(54) FOLDABLE ELECTONIC APPARATUS

(71) Applicant: Samsung Display Co., Ltd., Yongin-Si (KR)

(72) Inventors: Seung-lyong Bok, Hwaseong-si (KR); Jun-woo Hyung, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/560,133

(22) Filed: Sep. 4, 2019

(65) Prior Publication Data
US 2020/0073495 A1    Mar. 5, 2020

(30) Foreign Application Priority Data

Sep. 4, 2018 (KR) .......................... 10-2018-0105279

(51) Int. Cl.
*G06F 3/044* (2006.01)
*G01L 1/22* (2006.01)
(Continued)

(52) U.S. Cl.
CPC .......... *G01L 1/2206* (2013.01); *G01L 1/2287* (2013.01); *G01N 3/20* (2013.01); *G06F 1/1616* (2013.01); *G06F 1/1652* (2013.01); *G06F 3/044* (2013.01); *G06F 3/0412* (2013.01); *G09G 3/2092* (2013.01); *H01L 27/3272* (2013.01); *G06F 2203/04102* (2013.01); *G06F 2203/04103* (2013.01); *G09G 2330/12* (2013.01); *G09G 2380/02* (2013.01)

(58) Field of Classification Search
CPC ...... G06F 3/044; G06F 3/0412; G06F 1/1616; G06F 1/1652; G06F 2203/04102; G06F 2203/04103; G01L 1/2206; G01L 1/2287; G01N 3/20; G09G 3/2092; G09G 2330/12; H01L 27/3272
See application file for complete search history.

(56) References Cited

U.S. PATENT DOCUMENTS 7,759,863 B2    7/2010    Kim et al.
9,563,320 B2    2/2017    Lee et al.
(Continued)

FOREIGN PATENT DOCUMENTS

KR    1020160024605 A    3/2016
KR    1020160025889 A    3/2016
(Continued)

*Primary Examiner* — Wing H Chow
(74) *Attorney, Agent, or Firm* — Cantor Colburn LLP

(57) ABSTRACT

An electronic apparatus includes a base substrate including a planar part and a folding part, which is connected to a side of the planar part and is foldable along a folding axis extending in a predetermined direction, where the base substrate includes a front surface including an active region and a peripheral region adjacent to the active region, when viewed from a plan view in a thickness thereof, a plurality of pixels disposed on the front surface and in the active region, an encapsulation layer covering the pixels, a strain-sensing pattern disposed on the front surface, in the active region, and on the folding part, and a plurality of pixel pads disposed on the peripheral region. The strain-sensing pattern is disposed between the base substrate and the encapsulation layer.

8 Claims, 31 Drawing Sheets

(51) Int. Cl.
  *G01N 3/20*   (2006.01)
  *G06F 1/16*   (2006.01)
  *G06F 3/041*  (2006.01)
  *H01L 27/32*  (2006.01)
  *G09G 3/20*   (2006.01)

(56) References Cited

U.S. PATENT DOCUMENTS

| | | | |
|---|---|---|---|
| 9,934,723 | B2 | 4/2018 | Lee et al. |
| 9,947,255 | B2 | 4/2018 | Zhang et al. |
| 2015/0091016 | A1* | 4/2015 | Chen ............... G02F 1/1362 257/72 |
| 2016/0062412 | A1 | 3/2016 | Park et al. |
| 2016/0181345 | A1* | 6/2016 | Lee ................. H05K 1/028 257/40 |
| 2017/0060189 | A1* | 3/2017 | Sohn ............... G06F 3/017 |
| 2017/0060283 | A1 | 3/2017 | Sohn et al. |
| 2018/0059839 | A1 | 3/2018 | Kim et al. |
| 2018/0088629 | A1 | 3/2018 | Kim |
| 2018/0174505 | A1* | 6/2018 | Mandlik ........... G09G 3/3677 |

FOREIGN PATENT DOCUMENTS

| | | |
|---|---|---|
| KR | 1020170024672 A | 3/2017 |
| KR | 1020170025620 A | 3/2017 |
| KR | 1020170026046 A | 3/2017 |
| KR | 1020170095846 A | 8/2017 |
| KR | 1020180023791 A | 3/2018 |
| KR | 1020180033355 A | 4/2018 |
| KR | 1020180034109 A | 4/2018 |

\* cited by examiner

FOLDABLE ELECTONIC APPARATUS

This application claims priority to Korean Patent Application No. 10-2018-0105279, filed on Sep. 4, 2018, and all the benefits accruing therefrom under 35 U.S.C. § 119, the content of which in its entirety is herein incorporated by reference.

BACKGROUND

1. Field

Such an disclosure relates to an electronic apparatus, and in particular, to a foldable electronic apparatus.

2. Description of the Related Art

Recently, bendable or foldable electronic apparatuses are being actively developed. Such an electronic apparatus typically includes a flexible display panel, a flexible touch panel, and various other members. A folding state of the electronic apparatus is determined depending on an intrinsic flexibility thereof and a magnitude of an external force exerted thereon.

SUMMARY

An embodiment of the invention provides a foldable electronic apparatus which obtains information on a folding state (e.g., on whether and how much the foldable electronic apparatus is folded).

According to an embodiment of the invention, an electronic apparatus includes a base substrate including a planar part and a folding part, which is connected to a side of the planar part and is foldable along a folding axis extending in a predetermined direction, where the base substrate includes a front surface including an active region and a peripheral region adjacent to the active region, when viewed from a plan view in a thickness thereof, a plurality of pixels disposed on the front surface and in the active region, an encapsulation layer covering the pixels, a strain-sensing pattern disposed on the front surface, in the active region, and on the folding part, and a plurality of pixel pads disposed on the peripheral region. In such an embodiment, the strain-sensing pattern is disposed between the base substrate and the encapsulation layer.

In an embodiment, each of the pixels may include a plurality of thin film transistors disposed on the base substrate, and an organic light emitting device disposed on the thin film transistors and connected to a thin film transistor of the thin film transistors, where the organic light emitting device may include a first electrode, a second electrode on the first electrode, and a light emitting layer between the first electrode and the second electrode. In such an embodiment, the thin film transistor of the thin film transistors may include a semiconductor pattern, a control electrode crossing the semiconductor pattern with an electrical insulation property therebetween, an input electrode coupled to an end of the semiconductor pattern, an output electrode spaced apart from the input electrode and coupled to an opposite end of the semiconductor pattern, and a light blocking pattern spaced apart from the control electrode with the semiconductor pattern interposed therebetween.

In an embodiment, the strain-sensing pattern may be disposed in a same layer as the light blocking pattern.

In an embodiment, the light blocking pattern may include a conductive material, and the strain-sensing pattern may include a same material as the light blocking pattern.

In an embodiment, the light blocking pattern may be coupled to the control electrode.

In an embodiment, the light blocking pattern receives a power voltage.

In an embodiment, the light blocking pattern may include an insulating material, and the strain-sensing pattern may include a different material from the light blocking pattern.

In an embodiment, the strain-sensing pattern may be disposed in a same layer as at least one of the control electrode, the input electrode, the output electrode, and the first electrode.

In an embodiment, the light emitting layers of the pixels define a plurality of light-emitting regions spaced apart from each other, when viewed from the plan view, and the strain-sensing pattern may not overlap the light-emitting regions, when viewed from the plan view.

In an embodiment, the strain-sensing pattern may be provided in plural, and the plurality of strain-sensing pattern may have at least two different shapes.

In an embodiment, the signal lines may include a plurality of gate lines which provides gate voltages to the pixels, respectively, a plurality of data lines which provides data voltages to the pixels, respectively, and a plurality of power lines which provides power voltages to the pixels, respectively. In such an embodiment, the strain-sensing pattern may be disposed in a same layer as one of the signal lines.

In an embodiment, the electronic apparatus may further include a strain-sensing pad disposed on the peripheral region and spaced apart from the pixel pads, a plurality of signal lines connecting the pixels to the pixel pads, and a strain-sensing line connecting the strain-sensing pattern to the strain-sensing pad.

In an embodiment, the strain-sensing pattern and the strain-sensing pad may be disposed in different layers from each other.

In an embodiment, the strain-sensing line may be spaced apart from the strain-sensing pattern or the strain-sensing pad with an insulating layer interposed therebetween, and the strain-sensing line may be disposed through the insulating layer and may be coupled to the strain-sensing pattern or the strain-sensing pad.

In an embodiment, the strain-sensing line may include a plurality of lines spaced apart from each other with an insulating layer interposed therebetween, and the lines may be disposed through the insulating layer and may be connected to each other.

In an embodiment, the base substrate may further include a bending portion, which is spaced apart from the folding part in a direction crossing the predetermined direction and is bendable along a bending axis parallel to the folding axis, and the strain-sensing line may be connected to the strain-sensing pad via the bending portion.

In an embodiment, the strain-sensing pattern and the strain-sensing pad may be disposed in a same layer as each other.

In an embodiment, the pixel pads may be disposed on the planar part of the peripheral region, and the strain-sensing pad may be disposed on the folding part of the peripheral region.

In an embodiment, the folding part may include a plurality of folding parts arranged in a direction crossing the predetermined direction, and the strain-sensing pattern may include a plurality of strain-sensing patterns disposed on the plurality of folding parts, respectively.

According to some embodiments of the invention, an electronic apparatus includes a base substrate including a front surface including an active region and a peripheral region adjacent to the active region, a pixel layer disposed on the front surface and in the active region, where the pixel layer includes a semiconductor pattern, a plurality of conductive patterns, and a plurality of insulating layers, a touch-sensing layer disposed on the pixel layer, where the touch-sensing layer includes a touch sensor, and a strain-sensing pattern disposed on the front surface and in the active region. In such an embodiment, the strain-sensing pattern is disposed in a same layer as one of the conductive patterns of the pixel layer and the touch sensor.

In an embodiment, the conductive patterns may include a control electrode overlapping the semiconductor pattern, a light blocking pattern spaced apart from the control electrode with the semiconductor pattern interposed therebetween, an input electrode coupled to an end of the semiconductor pattern, and an output electrode coupled to an opposite end of the semiconductor pattern, and the strain-sensing pattern may be spaced apart from the one of the conductive patterns disposed in the same layer, when viewed from a plan view in a thickness direction of the base substrate.

In an embodiment, the active region may include a plurality of light-emitting regions, which are spaced apart from each other, and a non-light-emitting region, which is adjacent to the light-emitting regions, when viewed from a plan view in a thickness direction of the base substrate. In such an embodiment, the strain-sensing pattern may overlap the non-light-emitting region and may be spaced apart from the light-emitting regions.

According to some embodiments of the invention, an electronic apparatus includes a display panel including a plurality of signal lines, where the display panel includes an active region with a plurality of light-emitting regions and a peripheral region adjacent to the active region, when viewed from a plan view in a thickness direction of the base substrate, and a strain-sensing pattern disposed on the active region. In such an embodiment, the strain-sensing pattern is disposed in a same layer, and formed of a same material, as one of the signal lines.

In an embodiment, the signal lines may include a gate line extending in a predetermined direction, a data line extending in a direction crossing the predetermined direction, and a power line electrically disconnected from the gate line and the data line.

According to some embodiments of the invention, an electronic apparatus includes a base substrate including an active region and a peripheral region adjacent to the active region, a plurality of pixels spaced apart from each other on the active region, where each of the plurality of pixels includes a thin film transistor, a display device, and a lower conductive layer, which is disposed below the thin film transistor and overlaps the thin film transistor when viewed from a plan view in a thickness direction of the base substrate, and a crack-sensing pattern disposed on the active region and extended to be adjacent to at least two of the pixels. In such an embodiment, the crack-sensing pattern is disposed in a same layer as the lower conductive layer.

In an embodiment, the thin film transistor may include a semiconductor pattern, a control electrode spaced apart from the lower conductive layer with the semiconductor pattern interposed therebetween, an input electrode coupled to an end of the semiconductor pattern, and an output electrode coupled to an opposite end of the semiconductor pattern.

In an embodiment, the lower conductive layer and the control electrode may be provided with a same voltage as each other.

In an embodiment, the lower conductive layer and the input electrode may be provided with a same voltage as each other.

According to some embodiments of the invention, an electronic apparatus includes a base substrate including an active region and a peripheral region adjacent to the active region, a plurality of pixels, which are spaced apart from each other on the active region, where each of the pixels includes a thin film transistor and a display device, a strain-sensing pattern disposed on the active region, and a crack-sensing pattern disposed on the active region and spaced apart from the strain-sensing pattern. In such an embodiment, the strain-sensing pattern and the crack-sensing pattern may be disposed in a same layer as each other.

BRIEF DESCRIPTION OF THE DRAWINGS

These and/or other features of the invention will become apparent and more readily appreciated from the following description of the exemplary embodiments, taken in conjunction with the accompanying drawings, in which.

DETAILED DESCRIPTION

Figure 1:
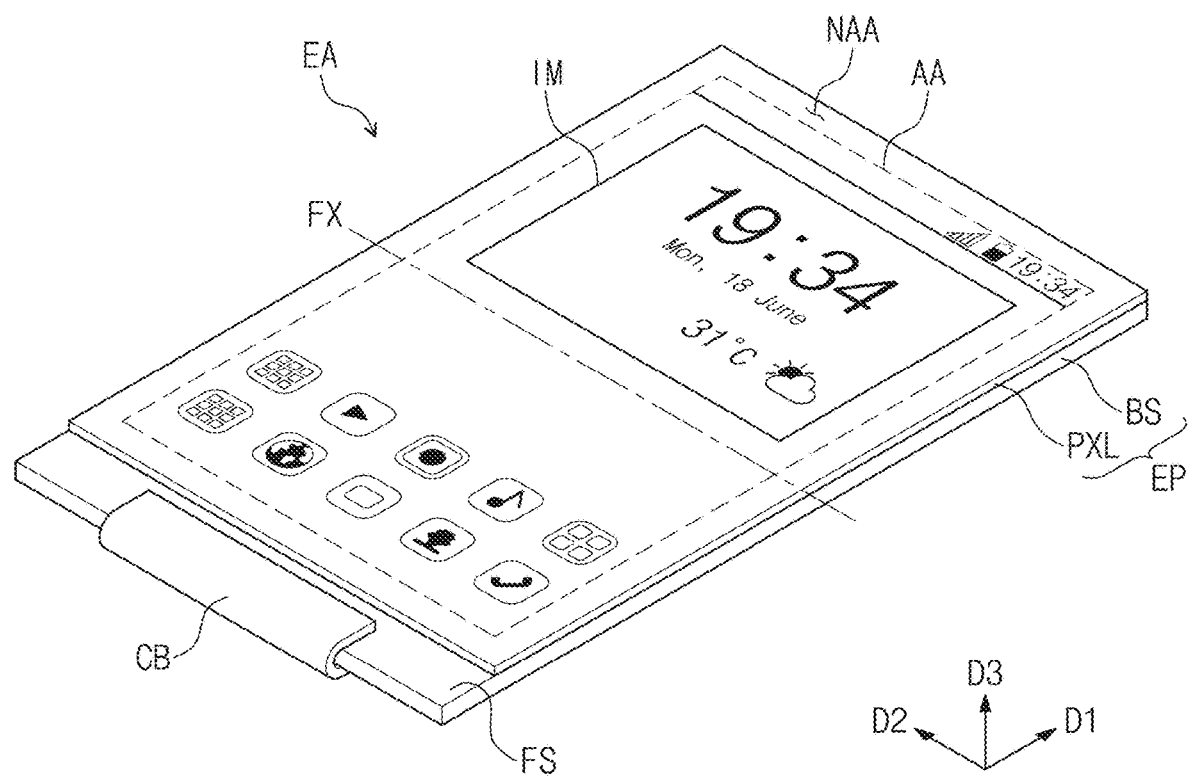
FIGS. 1, 2A, and 2B are perspective views illustrating an electronic apparatus according to an embodiment of the invention.

Exemplary embodiments of the inventions will now be described more fully with reference to the accompanying drawings, in which exemplary embodiments are shown. Exemplary embodiments of the inventions may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Like numbers indicate like elements throughout. As used herein, "Or" means "and/or." "At least A and B" means "A and/or B." The term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments of the inventions are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the inventions should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which exemplary embodiments of the inventions belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of the invention will be described in detail with reference to the accompanying drawings.

Figure 2A:
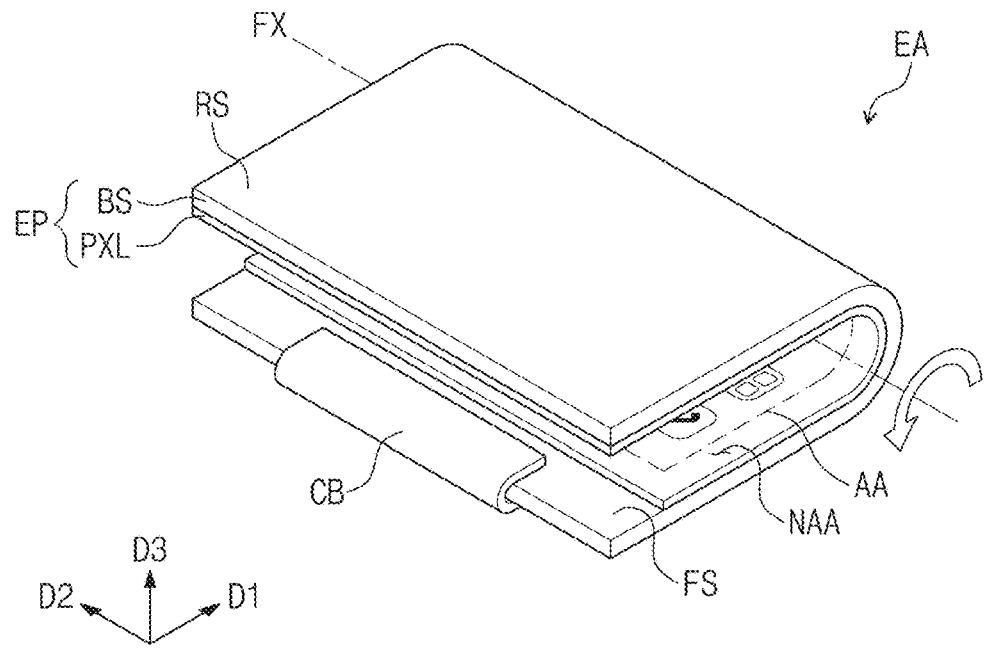
Figure 2B:
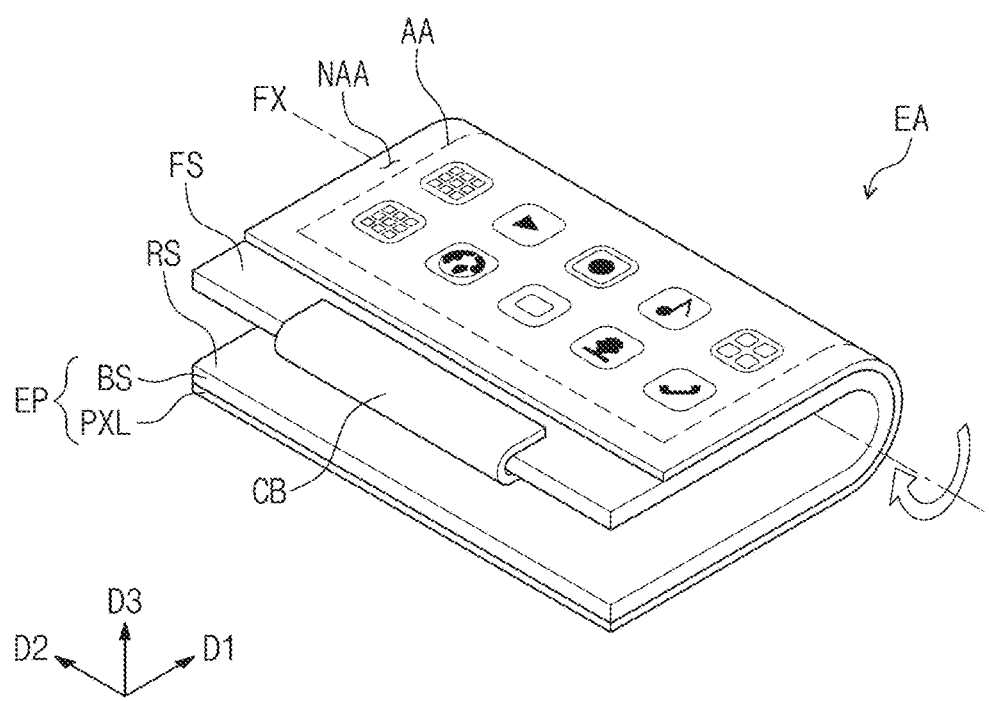

FIGS. 1, 2A, and 2B are perspective views illustrating an electronic apparatus according to an embodiment of the invention. FIG. 1 illustrates an electronic apparatus in an unfolded state, FIG. 2A illustrates an electronic apparatus that is folded in a first mode, and FIG. 2B illustrates an electronic apparatus that is folded in a second mode. Hereinafter, an embodiment of the invention will be described with reference to FIGS. 1 to 2B.

An embodiment of an electronic apparatus EA may be operated by an electrical signal applied thereto. The electronic apparatus EA may be or include at least one of various devices, such as a touch-sensing device, a display device, and a touch screen device, but the invention is not limited to a specific embodiment. For convenience of description, embodiments in which the electronic apparatus EA is a display device will hereinafter be described in detail. The electronic apparatus EA may display an image IM on a plane defined by a first direction D1 and a second direction D2.

The electronic apparatus EA may include an electronic panel EP and a circuit board CB. The electronic panel EP may include a base substrate BS and a pixel layer PXL. The base substrate BS may be formed of or include an insulating flexible material. The base substrate BS may have a flexible property.

The base substrate BS may include a front surface FS and a rear surface RS. The front surface FS and the rear surface RS may be opposite to or face each other in a third direction D3, and a distance between the front surface FS and the rear surface RS may correspond to a distance therebetween in a thickness of the base substrate BS.

The front surface FS may include an active region AA and a peripheral region NAA, when viewed in a top plan view which is a plan view in a third direction D3 perpendicular to the first direction D1 and the second direction D2. The active region AA may correspond to a region, on which the image IM is displayed.

In an embodiment, the peripheral region NAA may be adjacent to the active region AA. The peripheral region NAA may have a closed loop shape enclosing the active region AA, as shown in FIG. 1. However, the invention is not limited thereto, and in an alternative embodiment, the peripheral region NAA may be partially defined on one side of the active region AA.

The pixel layer PXL may be disposed on the base substrate BS. The pixel layer PXL may include a plurality of pixels (not shown). The pixels may be disposed on the active region AA and may output respective light constituting the image IM.

The circuit board CB may be coupled to the electronic panel EP. The circuit board CB may be disposed on an edge region of the electronic panel EP and may be electrically connected to the electronic panel EP. The circuit board CB may generate and provide an electrical signal to the electronic panel EP or may receive and process an electrical signal provided from the electronic panel EP.

The circuit board CB may be bent and assembled to face the rear surface RS of the electronic panel EP. The circuit board CB may generate and provide an electrical signal to the electronic panel EP.

The electronic apparatus EA may be variously deformed by an external force. The electronic apparatus EA may be unfolded, may be rolled to form a curved surface, or may be partially folded, depending on a direction or magnitude of the external force.

The deformation of the electronic apparatus EA may be substantially determined by deformation of the electronic panel EP. The external force exerted on the electronic apparatus EA may be substantially exerted on the base substrate BS to cause the folding of the base substrate BS, and the folding of the base substrate BS may lead to folding of the pixel layer PXL.

The electronic panel EP may be folded along a folding axis FX extending in the second direction D2. Depending on the folding direction of the electronic panel EP, the folding state of the electronic apparatus EA may be classified into two modes: a first mode (or a first folded state) and a second mode (or a second folded state).

In an embodiment, as shown in FIG. 2A, when the electronic apparatus EA is in the first mode, the electronic apparatus EA may be folded in a way such that the front surface FS of the base substrate BS encloses the folding axis FX. In the first mode, the base substrate BS may be exposed to the outside, and the active region AA may be veiled by the base substrate BS and may not be exposed to the outside.

In such an embodiment, as shown in FIG. 2B, when the electronic apparatus EA is in the second mode, the electronic apparatus EA may be folded in a way such that the rear surface RS of the base substrate BS encloses the folding axis FX. In the second mode, the pixel layer PXL may be exposed to the outside.

An embodiment of the electronic apparatus EA according to the invention may be folded along the folding axis FX in various directions by an external force to have various shapes. In such an embodiment, the extent of the folding of the electronic apparatus EA may be controlled by a magnitude of the external force. The electronic apparatus EA may obtain information on the folding state thereof (e.g., on whether and how much the electronic apparatus EA is folded) and may perform an operation of displaying the image IM or changing contents of the image IM based on the information. Since the electronic apparatus EA is provided to be deformable under an external force, the electronic apparatus EA may have a shape that is appropriate to various intentions of a user.

Figure 3A:
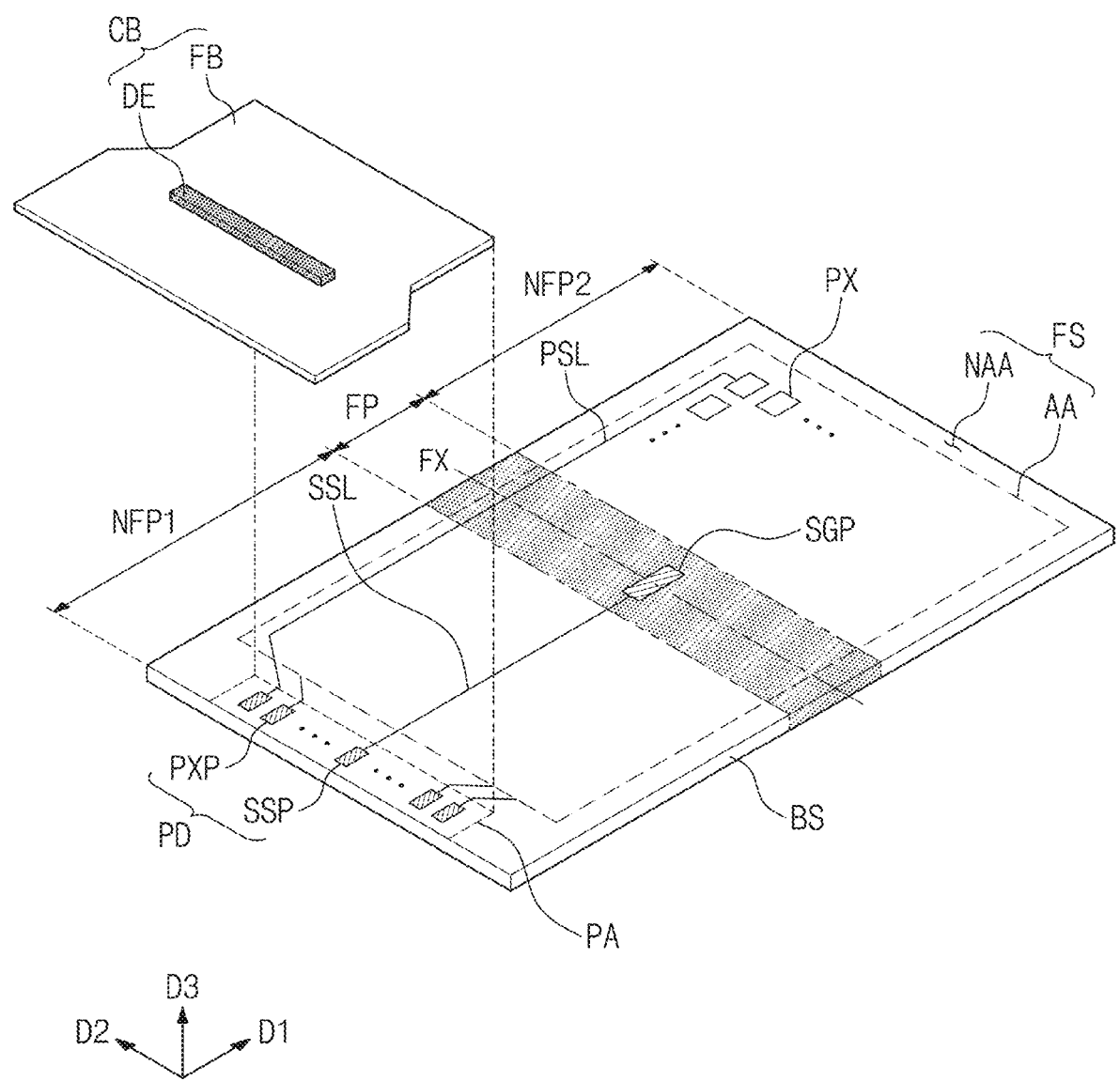
FIG. 3A is an exploded perspective view illustrating an electronic apparatus according to an embodiment of the invention.
Figure 3B:
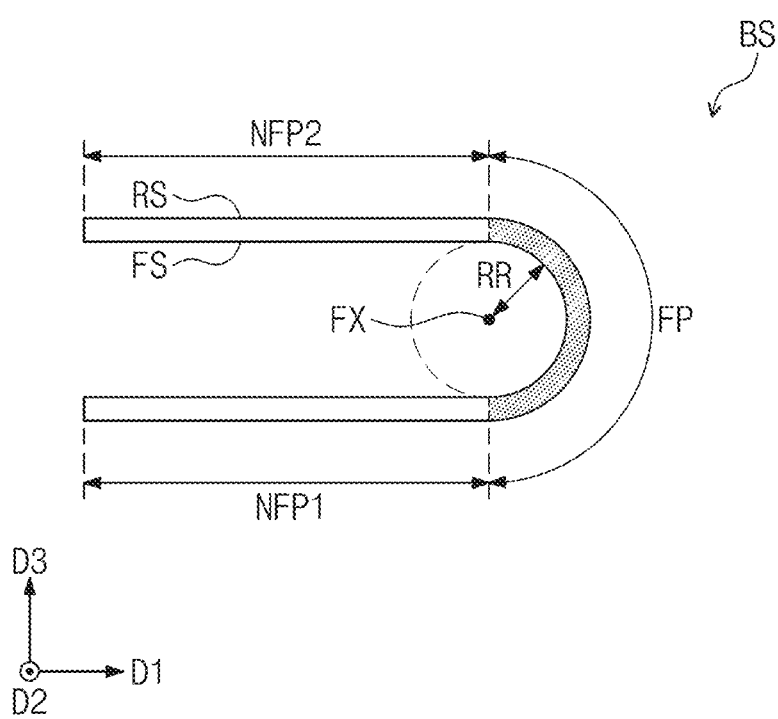
FIG. 3B is a sectional view illustrating some elements of the electronic apparatus of FIG. 3A.

FIG. 3A is an exploded perspective view illustrating an electronic apparatus according to an embodiment of the invention. FIG. 3B is a sectional view illustrating some elements of the electronic apparatus of FIG. 3A. FIG. 3B is a section view illustrating the first mode of the base substrate BS, which is one of elements shown in FIG. 3A. Hereinafter, an embodiment of the invention will be described with reference to FIGS. 3A and 3B. For concise description, a same or like element previously described with reference to FIGS. 1, 2A, and 2B may be identified by the same reference number and any repetitive detailed description thereof will be omitted.

In an embodiment, as described above, the electronic apparatus EA may include the electronic panel EP and the circuit board CB. For convenience in illustration, in FIG. 3A, the circuit board CB is illustrated to be separated from the electronic panel EP, and the pixel layer PXL is illustrated as elements disposed on the front surface FS of the base substrate BS.

Referring to FIGS. 3A and 3B, the base substrate BS may be folded along the folding axis FX. The base substrate BS may include a folding part FP, a first planar part NFP1, and a second planar part NFP2. The first planar part NFP1, the folding part FP, and the second planar part NFP2 may be sequentially arranged in the first direction D1. The first planar part NFP1, the folding part FP and the second planar part NFP2 may be connected to each other, thereby constituting a single structure or integrally forming as a single unitary and indivisible unit. For convenience in illustration, the folding part FP is depicted as a shaded region in FIGS. 3A and 3B.

The folding part FP may be folded along the folding axis FX. The folding part FP may be defined as a portion whose shape is changed when the electronic panel EP is folded. In the first mode, the folding part FP may be folded along the folding axis FX to have a semi-circular shape with a specific radius (or radius of curvature) RR in a vertical section defined by the first and third directions D1 and D3. In such an embodiment, a folding stress may be exerted on the folding part FP due to the folding of the electronic panel EP.

The first planar part NFP1 may be adjacent to a side of the folding part FP, and the second planar part NFP2 may be adjacent to an opposite side of the folding part FP. The first planar part NFP1 and the second planar part NFP2 may be spaced apart from each other in the first direction D1 with the folding part FP interposed therebetween.

The first planar part NFP1 and the second planar part NFP2 may be portions whose shapes are not changed even when the electronic panel EP is folded.

The pixel layer PXL may include a plurality of pixels PX, a plurality of signal lines SSL and PSL, a plurality of pads PD, and a strain-sensing pattern SGP, which are disposed on the base substrate BS. The pixels PX may be disposed in the active region AA.

In such an embodiment, the pixels PX are illustrated to have shapes corresponding to those of light-emitting regions. The light-emitting regions may be regions, on which lights generated by the pixels PX are displayed, and may be spaced apart from each other in the active region AA. However, the invention is not limited thereto, and in an alternative embodiment, the pixels PX may have shapes different from those of the light-emitting regions, and some adjacent ones of the pixels PX may overlap each other in a plan view. In an embodiment, the pixels PX in the electronic panel EP may be arranged in at least one of various shapes, and the invention is not limited to a specific embodiment.

In an embodiment, the strain-sensing pattern SGP may be disposed on the folding part FP. In such an embodiment, the strain-sensing pattern SGP may be disposed on a region of the folding part FP overlapping the active region AA. Resistance of the strain-sensing pattern SGP may be determined depending on information on a folding state of the electronic panel EP (e.g., on whether and how much the electronic panel EP is folded). In such an embodiment, where the strain-sensing pattern SGP is disposed on a deformable portion (e.g., the folding part FP) of the base substrate BS, the strain-sensing pattern SGP may have resistance that is changed in response to the deformation of the folding part FP. The change in resistance of the strain-sensing pattern SGP may be provided to a user as information on the folding state of the electronic panel EP. This will be described in greater detail below.

The pads PD may be disposed on the peripheral region NAA. The pads PD may be d on a pad region PA, which is a portion of the peripheral region NAA. The pads PD may be spaced apart from each other in the second direction D2. The pads PD may include a pixel pad PXP and a strain-sensing pad SSP. In such an embodiment, the pixel pad PXP and the strain-sensing pad SSP may be disposed on the first planar part NFP1.

The signal lines PSL and SSL may include a pixel signal line PSL and a strain-sensing line SSL. The pixel signal line PSL may connect one of the pixels PX to a corresponding one of the pads PD. The strain-sensing line SSL may connect the strain-sensing pattern SGP to the strain-sensing pad SSP. The pixel signal line PSL and the strain-sensing line SSL may be electrically disconnected or insulated from each other.

The circuit board CB may be disposed on the pad region PA that is defined in the peripheral region NAA. The circuit board CB may be electrically coupled to the pixels PX and the strain-sensing pattern SGP, which are disposed on the active region AA, through the pads PD of the electronic panel EP.

The circuit board CB may include a flexible film FB and a driver circuit DE. The flexible film FB may be directly attached to the electronic panel EP by a conductive adhesive element (not shown). The flexible film FB may have a flexible property. Accordingly, the flexible film FB may be assembled to have a bent shape and to face the rear surface of the electronic panel EP.

The driver circuit DE may be disposed or mounted on the flexible film FB. The driver circuit DE may be electrically connected to the flexible film FB through circuit lines (not shown) included in the flexible film FB. The flexible film FB may electrically connect the driver circuit DE to the electronic panel EP, and the driver circuit DE may generate an electrical signal to be provided to the electronic panel EP, or may process an electrical signal provided from the electronic panel EP.

The driver circuit DE may include a pixel driver circuit for driving the pixels PX. In one embodiment, for example, the driver circuit DE may include a gate driver circuit for generating gate signals or a data driver circuit for generating data signals. In addition, the driver circuit DE may include a sensing circuit, which drives the strain-sensing pattern SGP and processes a sensing signal provided from the strain-sensing pattern SGP. However, the invention is not limited thereto, and in an embodiment, the driver circuit DE may include various control circuits, which generate and process various control signals for driving the electronic panel EP.

According to an embodiment of the invention, since a single circuit board CB may be used to drive not only the pixels PX but also the strain-sensing pattern SGP, such that an assembling process may be simplified. However, the invention is not limited thereto, and in an alternative embodiment, the electronic apparatus EA may include separate circuit boards, which are respectively connected to the pixel pad PXP and the strain-sensing pad SSP.

Figure 4A:
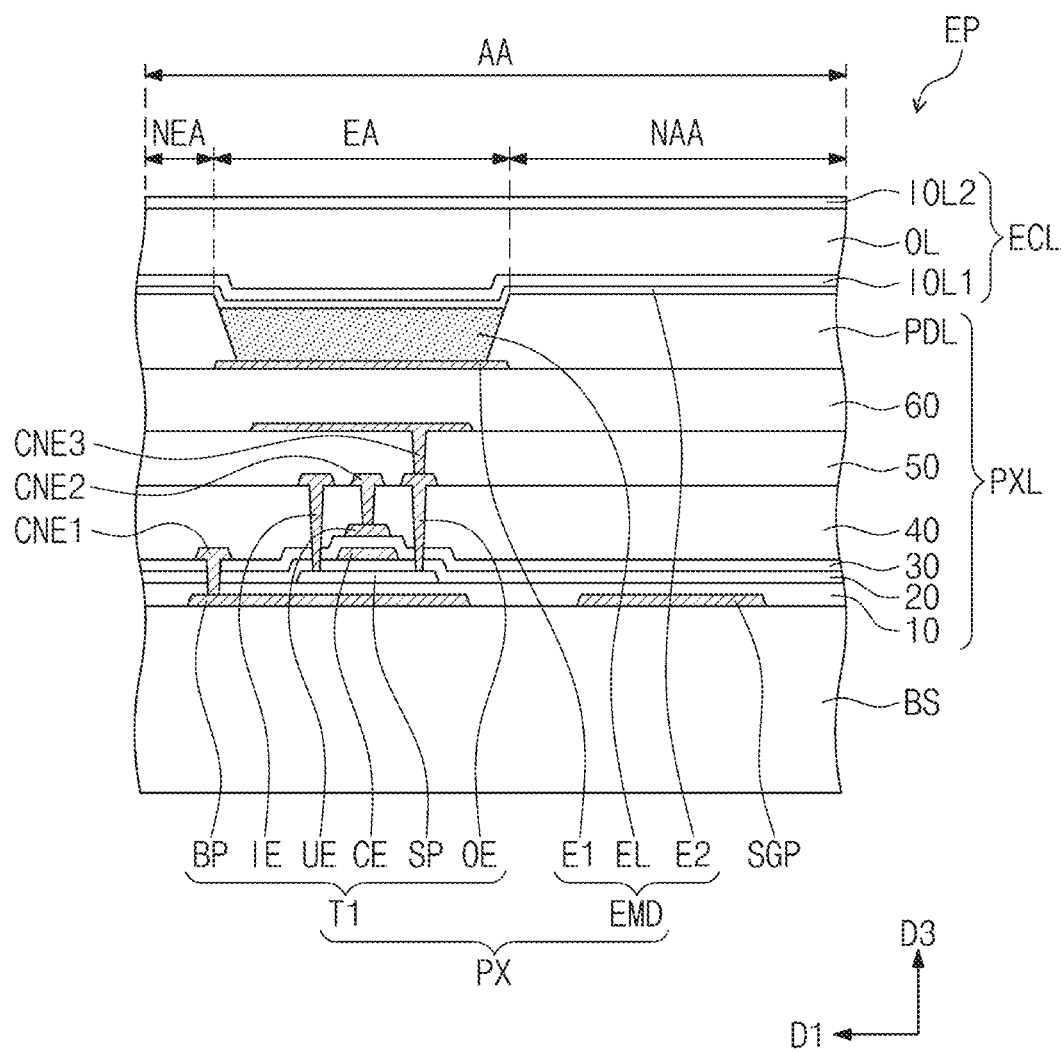
FIGS. 4A to 4C are sectional views each illustrating a portion of an electronic panel according to an embodiment of the invention.
Figure 4B:
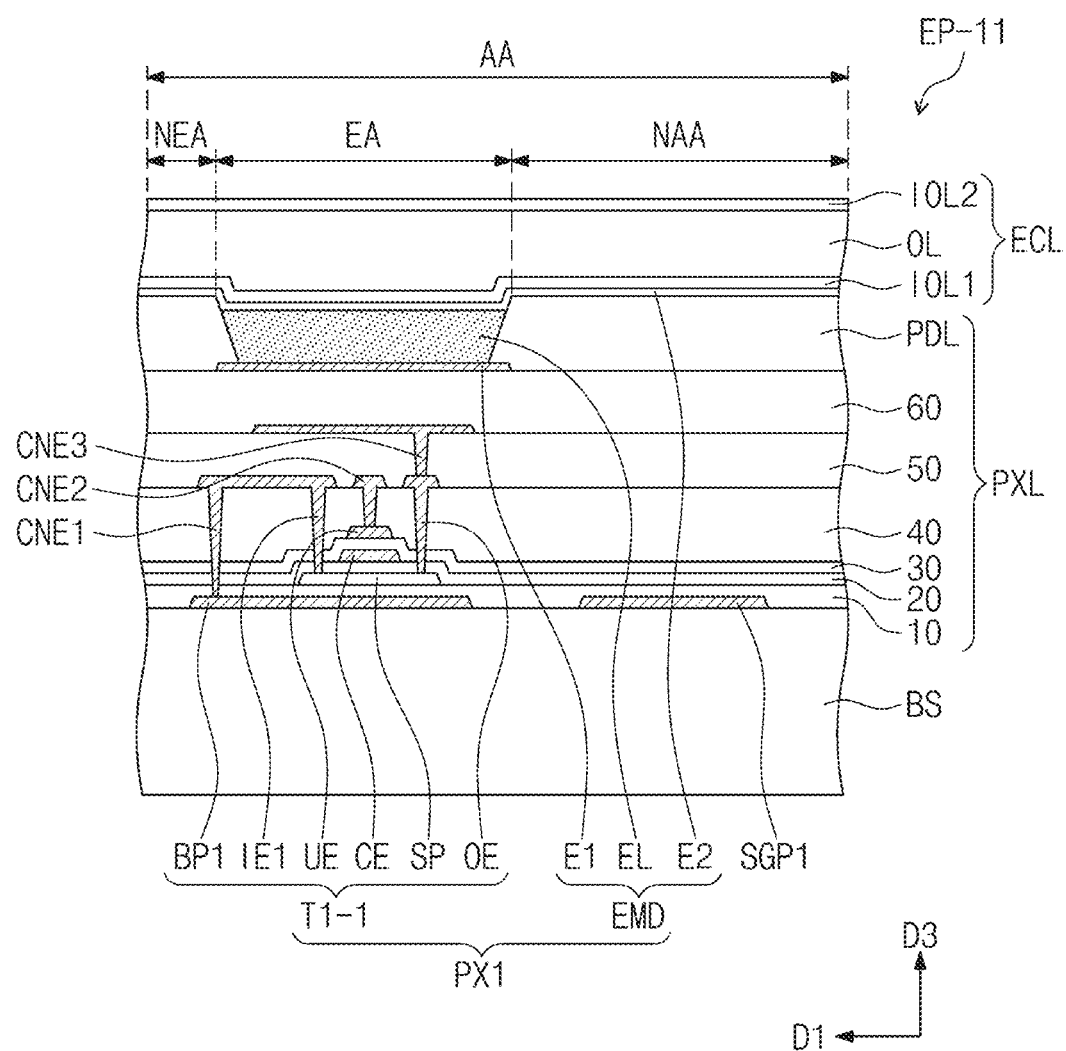
Figure 4C:
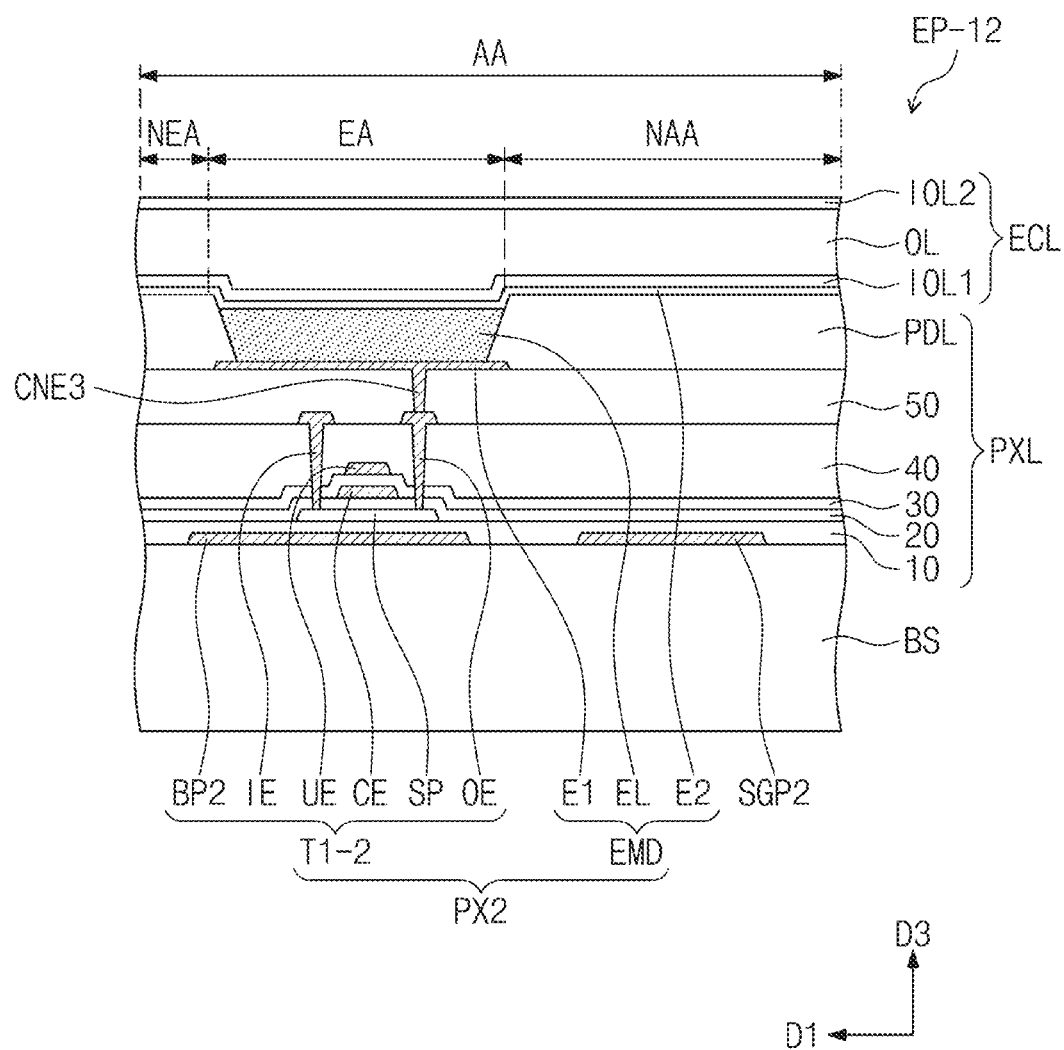

FIGS. 4A to 4C are sectional views each illustrating a portion of an electronic panel according to an embodiment of the invention. FIGS. 4A to 4C illustrate a portion of the active region AA corresponding to the folding part FP (e.g., see FIG. 3A). Each of FIGS. 4A to 4C is a sectional view of a portion including one of the pixels. Hereinafter, an embodiment of the invention will be described with reference to FIGS. 4A to 4C. For concise description, a same or like element previously described with reference to FIGS. 1, 2A, 2B, 3A, and 3B may be identified by the same reference number and any repetitive detailed description thereof will be omitted.

In an embodiment, as shown in FIG. 4A, the pixel layer PXL may include the pixel PX, the strain-sensing pattern SGP, and a plurality of insulating layers 10, 20, 30, 40, 50, 60 and PDL. The insulating layers 10, 20, 30, 40, 50, 60, and PDL may include a first insulating layer 10, a second insulating layer 20, a third insulating layer 30, a fourth insulating layer 40, a fifth insulating layer 50, a sixth insulating layer 60, and a pixel definition layer PDL, which are sequentially stacked one on another in the third direction D3. Herein, the third direction D3 may be a thickness direction of the base substrate BS. In an embodiment, the pixel PX may include a plurality of thin film transistors and a light-emitting device EMD. One (e.g., a first thin film transistor T1) of the thin film transistors is exemplarily illustrated in FIG. 4A.

The first thin film transistor T1 may be disposed on the base substrate BS. The first thin film transistor T1 may include a semiconductor pattern SP, a control electrode CE, an input electrode IE, an output electrode OE, an upper electrode UE, and a light blocking pattern BP.

The semiconductor pattern SP may be disposed between the first insulating layer 10 and the second insulating layer 20. The control electrode CE may be disposed between the second insulating layer 20 and the third insulating layer 30. The control electrode CE may overlap the semiconductor pattern SP, when viewed in a plan view or when viewed from a plan view in the third direction D3. The input electrode IE and the output electrode OE may be disposed between the fourth insulating layer 40 and the fifth insulating layer 50. The input electrode IE and the output electrode OE may be disposed on the same layer to be spaced apart from each other. The input electrode IE and the output electrode OE may penetrate or be disposed through the second insulating layer 20, the third insulating layer 30 and the fourth insulating layer 40, and may be respectively coupled to two opposite ends of the semiconductor pattern SP.

The upper electrode UE may be disposed between the third insulating layer 30 and the fourth insulating layer 40. The upper electrode UE may overlap the control electrode CE, when viewed in a plan view. The upper electrode UE may receive various voltages. In an embodiment, the upper electrode UE and the control electrode CE may constitute or collective define a capacitor, and in such an embodiment, the upper electrode UE may receive a voltage, which is different from that applied to the control electrode CE. In an alternative embodiment, the upper electrode UE may be connected to the control electrode CE to receive a same voltage as the control electrode CE. In another alternative embodiment, the upper electrode UE may be omitted from the electronic panel EP.

The light blocking pattern BP may be disposed between the base substrate BS and the first insulating layer 10. The light blocking pattern BP may overlap the entirety of at least the semiconductor pattern SP, when viewed in a direction toward the rear surface RS of the base substrate BS or the third direction D3. The light blocking pattern BP may block light from being incident into the semiconductor pattern SP.

In such an embodiment, the light blocking pattern BP may be formed of or include a conductive material. In one embodiment, for example, the light blocking pattern BP may be formed of or include at least one of metals, alloys, conductive oxides, and conductive polymers.

In such an embodiment, the electronic panel EP may include a plurality of connection electrodes CNE1, CNE2, and CNE3. In one embodiment, for example, the connection electrodes CNE1, CNE2, and CNE3 may include a first connection electrode CNE1, a second connection electrode CNE2, and a third connection electrode CNE3, as shown in FIG. 4A.

The first connection electrode CNE1 may be disposed at a different level or in a different layer from the light blocking pattern BP and may be coupled to the light blocking pattern BP. The first connection electrode CNE1 may be disposed between the third insulating layer 30 and the fourth insulating layer 40. In an embodiment where the first connection electrode CNE1 includes a same material as the upper electrode UE, the first connection electrode CNE1 and the upper electrode UE may be formed at the same time or during a same process. The first connection electrode CNE1 may penetrate or be disposed through the first insulating layer 10, the second insulating layer 20 and the third insulating layer 30, and may be coupled to the light blocking pattern BP.

The first connection electrode CNE1 may transfer an electrical signal to the light blocking pattern BP. In such an embodiment, the first connection electrode CNE1 may be connected to a power line (not shown) to provide a power voltage (hereinafter, a first power voltage) to the light blocking pattern BP.

The second connection electrode CNE2 may be disposed at a different level or in a different layer from the upper electrode UE and may be coupled to the upper electrode UE. The second connection electrode CNE2 may be disposed between the fourth insulating layer 40 and the fifth insulating layer 50 to penetrate or be disposed through the fourth insulating layer 40 and may be coupled to the upper electrode UE. In an embodiment where the second connection electrode CNE2 is formed of a same material as the input electrode IE and the output electrode OE, the second connection electrode CNE2 may be formed concurrently with the input electrode IE and the output electrode OE.

The second connection electrode CNE2 may transfer an electrical signal to the upper electrode UE. In such an embodiment, the second connection electrode CNE2 may provide a voltage, which is different from or the same as a voltage applied to the control electrode CE, to the upper electrode UE.

The third connection electrode CNE3 may be disposed at a different level or in a different layer from the output electrode OE and may be coupled to the output electrode OE. The third connection electrode CNE3 may be disposed between the fifth insulating layer 50 and the sixth insulating layer 60 to penetrate or be disposed through the fifth insulating layer 50 and may be coupled to the output electrode OE. The third connection electrode CNE3 may transfer an electrical signal, which is output through the output electrode OE, to another device (not shown), other than the first thin film transistor T1. In an alternative embodiment of the electronic panel EP, the third connection electrode CNE3 may be connected to the light-emitting device EMD.

The light-emitting device EMD may be disposed on the sixth insulating layer 60. The light-emitting device EMD may include a first electrode E1, a light emitting layer EL, and a second electrode E2, which are sequentially stacked one on another in the third direction D3.

The first electrode E1 may be spaced apart from the first thin film transistor T1 with the sixth insulating layer 60 interposed therebetween. However, the invention is not limited thereto, and in an alternative embodiment, the first electrode E1 may be disposed to penetrate or be disposed through the sixth insulating layer 60 and may be coupled to the first thin film transistor T1. In such an embodiment, the first electrode E1 may be coupled to the third connection electrode CNE3 or may be directly connected to the output electrode OE.

The pixel definition layer PDL may be disposed on the sixth insulating layer 60. An opening may be defined in the pixel definition layer PDL. The opening may be defined or formed to expose at least a portion of the first electrode E1. In an embodiment, a region, in which the opening of the pixel definition layer PDL is defined, may be referred to as a light-emitting region EA, and the remaining region, other than the opening, may be referred to as a non-light-emitting region NEA.

The light emitting layer EL may be disposed on the first electrode E1. The light emitting layer EL may include a light-emitting material. In one embodiment, for example, the light emitting layer EL may include or be formed of at least one of light emitting materials for emitting red, green or blue lights and may include at least one of fluorescent or phosphorescent materials. In an embodiment, the light emitting layer EL may be formed of or include an organic light emitting material or an inorganic light-emitting material such as quantum dots. The light emitting layer EL may emit a light in response to a potential difference between the first electrode E1 and the second electrode E2.

The second electrode E2 may be disposed on the light emitting layer EL. The second electrode E2 may face the first electrode E1. The second electrode E2 may be connected to a power terminal (not shown) to receive a power voltage. The light-emitting device EMD may receive a second power voltage, which is different from the first power voltage, through the second electrode E2.

The second electrode E2 may be formed of or include a transparent conductive material or a transflective conductive material. Thus, light generated by the light emitting layer EL may easily pass through the second electrode E2 and may propagate in the third direction D3. However, the invention is not limited thereto, and in an alternative embodiment, the light-emitting device EMD may be designed to have a back-side emission structure, in which the first electrode E1 includes a transparent or transflective material, or a double-sided emission structure, which is configured to allow light to be emitted through top and bottom surfaces thereof.

In an embodiment, although not shown, the light-emitting device EMD may further include an organic layer or an inorganic layer, which is disposed in at least one of regions between the light emitting layer EL and the first electrode E1 and between the light emitting layer EL and the second electrode E2. The organic or inorganic layer may control flow of electric charges, which are supplied from the first electrode E1 and the second electrode E2 to the light emitting layer EL, such that optical efficiency and lifespan of the light-emitting device EMD may be improved.

An encapsulation layer ECL may be disposed on the pixel layer PXL. The encapsulation layer ECL may be disposed on the light-emitting device EMD to encapsulate the light-emitting device EMD. Although not shown, a capping layer may be further disposed between the second electrode E2 and the encapsulation layer ECL to cover the second electrode E2.

The encapsulation layer ECL may include a first inorganic layer IOL1, an organic layer OL, and a second inorganic layer IOL2, which are sequentially stacked one on another in the third direction D3. However, the invention is not limited thereto, and alternatively, the encapsulation layer ECL may further include at least one of a plurality of inorganic layers and a plurality of organic layers.

The first inorganic layer IOL1 may cover the second electrode E2. The first inorganic layer IOL1 may effectively prevent external moisture or oxygen from entering the light-emitting device EMD. In one embodiment, for example, the first inorganic layer IOL1 may be formed of or include at least one of silicon nitride, silicon oxide, silicon oxynitride, an a compound thereof. The first inorganic layer IOL1 may be formed by a deposition process.

The organic layer OL may be disposed on the first inorganic layer IOL1 to be in contact with the first inorganic layer IOU. The organic layer OL may improve or planarize a non-uniform surface profile caused by the first inorganic layer IOU. In one embodiment, for example, the organic layer OL may cover an uneven top surface of the first inorganic layer IOL1 or particles on the first inorganic layer IOL1, to prevent the non-uniform surface profile of the first inorganic layer IOL1 or the particles from affecting elements to be disposed on the organic layer OL. In such an embodiment, the organic layer OL may relieve stress between layers that are in contact with each other. The organic layer OL may be formed of or include an organic material and may be formed by a solution-based film-forming process (e.g., a spin coating process, a slit coating process, or an inkjet process).

The second inorganic layer IOL2 may be disposed on the organic layer OL to cover the organic layer OL. In an embodiment, where the organic layer OL has a relatively flat top surface, the second inorganic layer IOL2 may be more stably formed, compared to the case of forming it on the first inorganic layer IOL1. The second inorganic layer IOL2 may encapsulate the organic layer OL, thereby effectively preventing moisture from being leaked from the organic layer OL to the outside. In one embodiment, for example, the second inorganic layer IOL2 may be formed of or include at least one of silicon nitride, silicon oxide, silicon oxynitride, and a compound thereof. The second inorganic layer IOL2 may be formed by a deposition process.

Although not shown, the encapsulation layer ECL may include a glass substrate. In such an embodiment, the encapsulation layer ECL may be coupled to the base substrate BS through a frit seal. The shape of the encapsulation layer ECL may be variously modified, as long as the encapsulation layer ECL encapsulates the light-emitting device EMD.

Alternatively, as shown in FIG. 4B, an electronic panel EP-11 may include a pixel PX1 with a first thin film transistor T1-1, which is different from the first thin film transistor T1 shown in FIG. 4A. In the first thin film transistor T1-1, a light blocking pattern BP1 may be coupled to an input electrode TEL The input electrode IE1 may be coupled to both of the light blocking pattern BP1 and the semiconductor pattern SP. When a voltage of each of the control electrode CE and the light blocking pattern BP1 is maintained to a specific voltage level, a plurality of channels may be formed in the semiconductor pattern SP.

Alternatively, as shown in FIG. 4C, an electronic panel EP-12 may include a pixel PX2 including a first thin film transistor T1-2 different from the first thin film transistor T1 shown in FIG. 4A. In the first thin film transistor T1-2, the first connection electrode CNE1 and the second connection electrode CNE2 may be omitted.

A light blocking pattern BP2 may include a conductive material. In an embodiment, the light blocking pattern BP2 may be a floating pattern. The light blocking pattern BP2 may be hermetically sealed by the first insulating layer 10 and may not be coupled to a conductive pattern or a conductive line adjacent thereto.

In an embodiment, the light blocking pattern BP2 may include an insulating material. In such an embodiment, the strain-sensing pattern SGP may be formed of a material different from the light blocking pattern BP2. Since the strain-sensing pattern SGP may be formed independently of the light blocking pattern BP2, various materials may be used for the light blocking pattern BP2, as long as the light blocking pattern BP2 effectively prevent light from being incident into the semiconductor pattern SP, and the material of the light blocking pattern BP2 is not limited to a specific material.

A structure of the first thin film transistor T1, T1-1, or T1-2 in the electronic panel EP, EP-11, or EP-12 may be variously modified. Furthermore, in the electronic panel EP, EP-11, or EP-12, the strain-sensing pattern SGP may be disposed at a same level or in a same layer as the light blocking pattern BP, BP1, or BP2. Thus, even when an additional layer for forming the strain-sensing pattern SGP is not provided, the strain-sensing pattern SGP may be formed using a layer for the light blocking pattern BP, BP1, or BP2, thereby simplifying a fabrication process.

Figure 5:
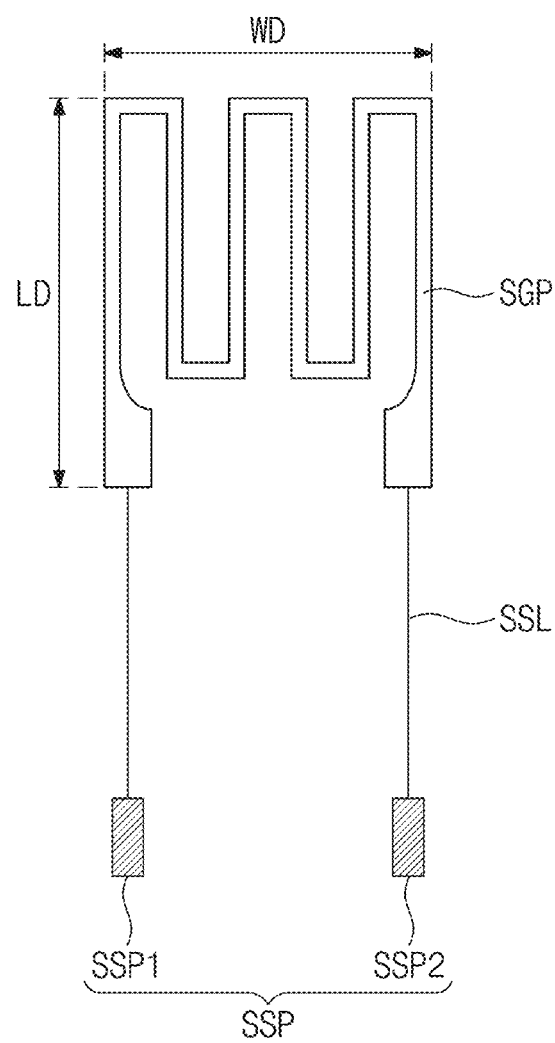
FIG. 5 is a plan view illustrating some elements of an electronic panel according to an embodiment of the invention.
Figure 6A:
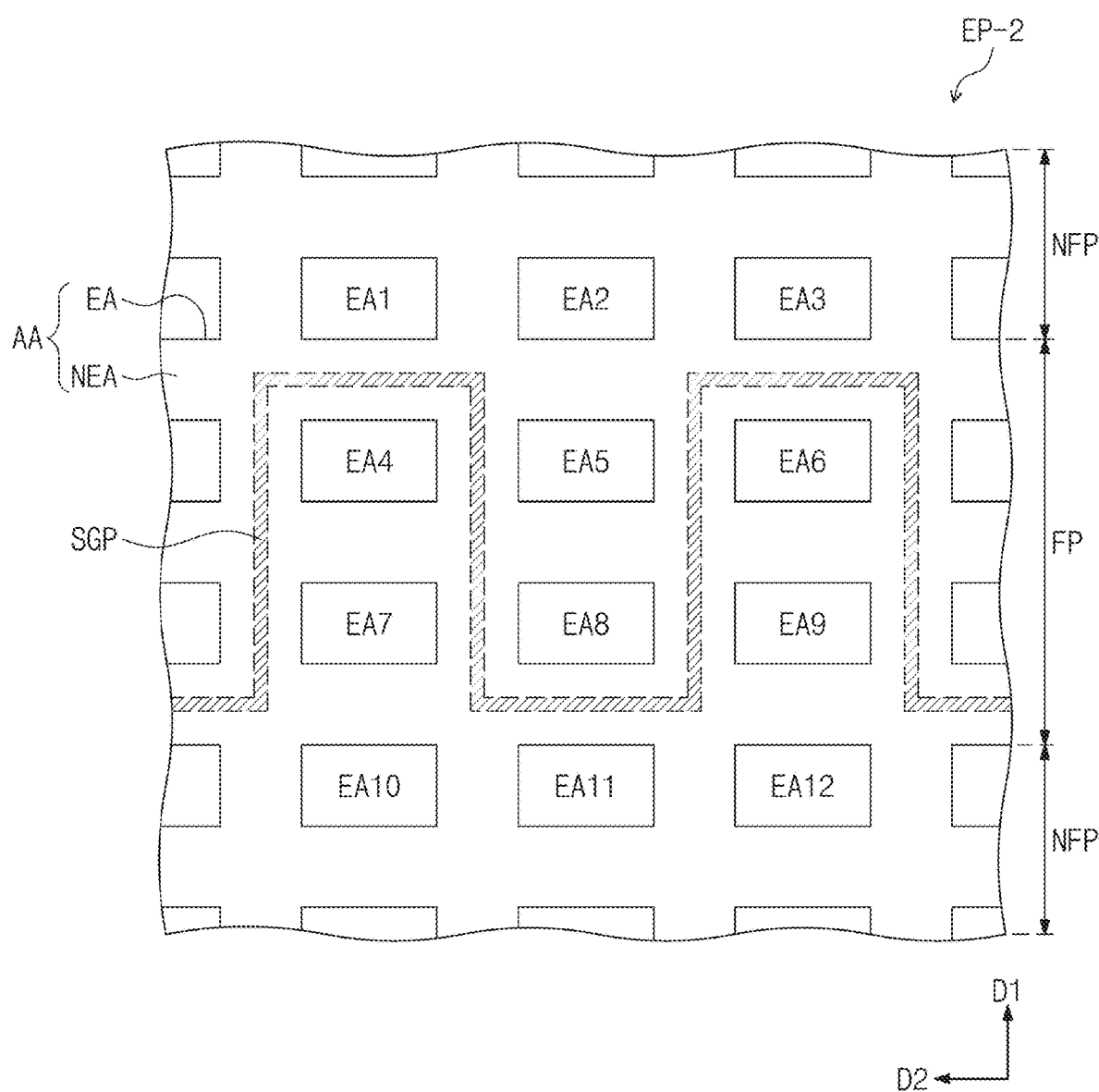
FIGS. 6A and 6B are plan views each schematically illustrating a portion of an electronic panel according to an embodiment of the invention.
Figure 6B:
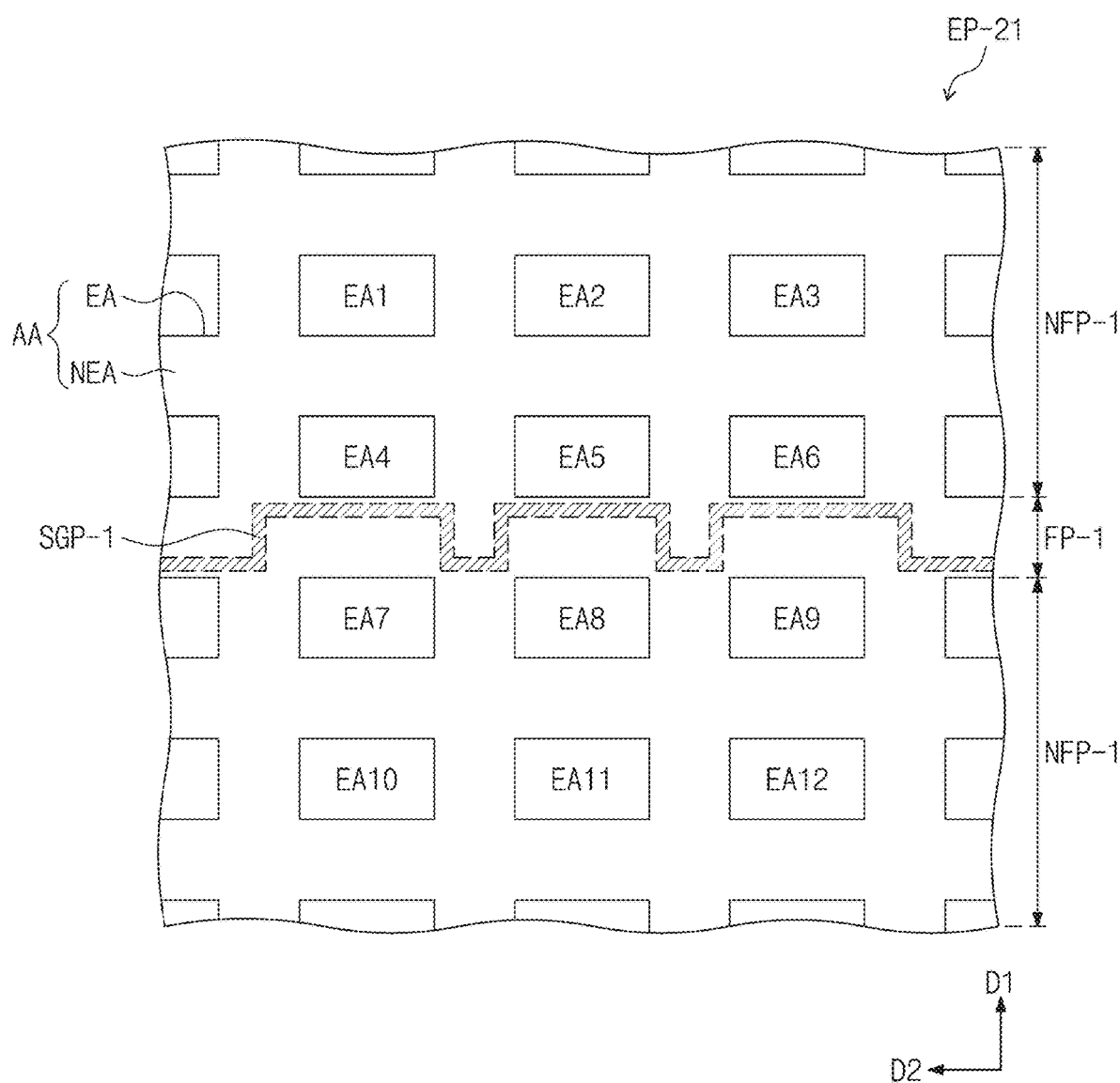

FIG. 5 is a plan view illustrating some elements of an electronic panel according to an embodiment of the invention. FIGS. 6A and 6B are plan views each schematically illustrating a portion of an electronic panel according to an embodiment of the invention. FIG. 5 illustrates a single strain-sensing sensor, and each of FIGS. 6A and 6B illustrates a portion of the active region AA including the folding part FP and a planar part NFP adjacent thereto. Hereinafter, an embodiment of the invention will be described with reference to FIGS. 5, 6A, and 6B.

As shown in FIG. 5, an embodiment of the strain-sensing sensor may include the strain-sensing pattern SGP, a strain-sensing line SSL, and the strain-sensing pad SSP. The strain-sensing line SSL is corresponding to the strain sensing line SSL described above. As described above, the strain-sensing pattern SGP may be disposed on the active region AA, and the strain-sensing pad SSP may be disposed on the peripheral region NAA (e.g., see FIG. 3A).

The strain-sensing pattern SGP may include a plurality of grid patterns. The grid patterns may be arranged in a specific direction and may be connected each other to constitute the strain-sensing pattern SGP as a single structure or to be integrally formed as single unitary and indivisible unit.

A sensing region, which is sensed by the strain-sensing pattern SGP, may be provided to have a rectangular shape and to have a width WD and a length LD, when viewed in a plan view. The strain-sensing pattern SGP shown in FIG. 3A may have a shape corresponding to a shape of the sensing region. The width WD of the sensing region (hereinafter, will be referred to as "SSP width") may be measured in an arrangement direction of the grid patterns and may correspond to the largest width between two opposite outermost ones of the grid patterns. The SSP width WD may be determined based on the number of the grid patterns and a width of each grid pattern.

The length LD of the sensing region (hereinafter, a SSP length) may be measured in an extension direction of the grid patterns and may correspond to a distance between the uppermost portion of the grid patterns and an end portion of the strain-sensing line SSL. The SSP length LD may vary depending on a length of each grid pattern.

The shape of the strain-sensing pattern SGP may be changed by an external force exerted thereon. In one embodiment, for example, the length LD and the width WD of the strain-sensing pattern SGP may be changed, when a folding state of the electronic panel is changed by the external force. The strain-sensing sensor may sense a change in resistance of the strain-sensing pattern SGP, which is caused by the physical deformation of the strain-sensing pattern SGP, such that a folding state of the electronic panel (e.g., on whether and how much the electronic panel is folded) may be effectively sensed or determined.

The strain-sensing line SSL may connect the strain-sensing pattern SGP to the strain-sensing pad SSP. In an embodiment, a plurality of the strain-sensing lines SSL may be provided. In one embodiment, for example, a plurality of the strain-sensing lines SSL may be respectively connected to two opposite ends of the strain-sensing pattern SGP.

The strain-sensing pad SSP may include a plurality of pads SSP1 and SSP2, which are respectively connected to the strain-sensing lines SSL. The strain-sensing pad SSP may receive a driving signal for driving the strain-sensing pad SSP through the circuit board CB (e.g., see FIG. 3A) or may provide information on a resistance change measured by the strain-sensing pad SSP to the circuit board CB. Although not shown, the circuit board CB may include a resistance change measuring circuit (e.g., Wheatstone bridge).

In an embodiment, as described above, the strain-sensing pattern SGP may be disposed on the folding part FP. The width WD and the length LD of the strain-sensing pattern SGP may vary depending on an area of the folding part FP.

FIGS. 6A and 6B illustrate a portion of the active region AA, in which twelve light-emitting regions EA1-EA12 are arranged in four rows and three columns. Hereinafter, an embodiment of the invention will be described with reference to FIGS. 6A and 6B.

In one embodiment, for example, as shown in FIG. 6A, in an electronic panel EP-2, the folding part FP may be provided to overlap a second row of the light-emitting regions (e.g., EA4, EA5, and EA6) and a third column of the light-emitting regions (e.g., EA7, EA8, and EA9). Here, the length LD of the strain-sensing pattern SGP may be defined in the first direction D1 and may be smaller than a distance between two separate light-emitting regions, which are respectively disposed on two separate planar parts NFP.

In one embodiment, for example, where, as shown in FIG. 6A, a width in the first direction D1 of the folding part FP corresponds to a distance between two light-emitting regions EA1 and EA10, which are spaced apart from each other in the first direction D1 and are respectively disposed on two separate planar parts NFP, the length LD of the strain-sensing pattern SGP may be equal to or smaller than the width in the first direction D1 of the folding part FP. Each of the grid patterns constituting the strain-sensing pattern SGP may have a size and shape enclosing or surrounding two light-emitting regions. In one embodiment, for example, as shown in FIG. 6A, each column of the light-emitting regions EA4, EA5, EA6, EA7, EA8, and EA9, which are disposed on the folding part FP, may be enclosed or surrounded by a corresponding one of the grid patterns.

Alternatively, as shown in FIG. 6B, in an electronic panel EP-21, a folding part FP-1 may be provided between two adjacent rows of the light-emitting regions EA1-EA12. A planar part NFP-1 is adjacent to the folding part FP-1. In one embodiment, for example, as shown in FIG. 6B, the folding part FP-1 may be provided between two rows, which are adjacent to each other in the first direction D1 (e.g., between the light-emitting regions EA4, EA5, and EA6 in the second row and the light-emitting regions EA7, EA8, and EA9 in the third row).

Thus, a width in the first direction D1 of the folding part FP-1 may correspond to a distance in the first direction D1 between the light-emitting regions. In such an embodiment, a length in the first direction D1 of a strain-sensing pattern SGP-1 may be smaller than a distance between two light-emitting regions adjacent to each other in the first direction D1.

According to an embodiment of the invention, a size or shape of the strain-sensing pattern SGP or SGP-1 may be variously modified based on an area and shape of the folding part FP or FP-1. According to an embodiment of the invention, since the strain-sensing pattern SGP or SGP-1 disposed on the folding part FP or FP-1 is designed to correspond to the shape of the folding part FP or FP-1 such that information on a folding state of the electronic panel may be effectively obtained, even when the shape of the folding part FP or FP-1 is variously modified.

Figure 7A:
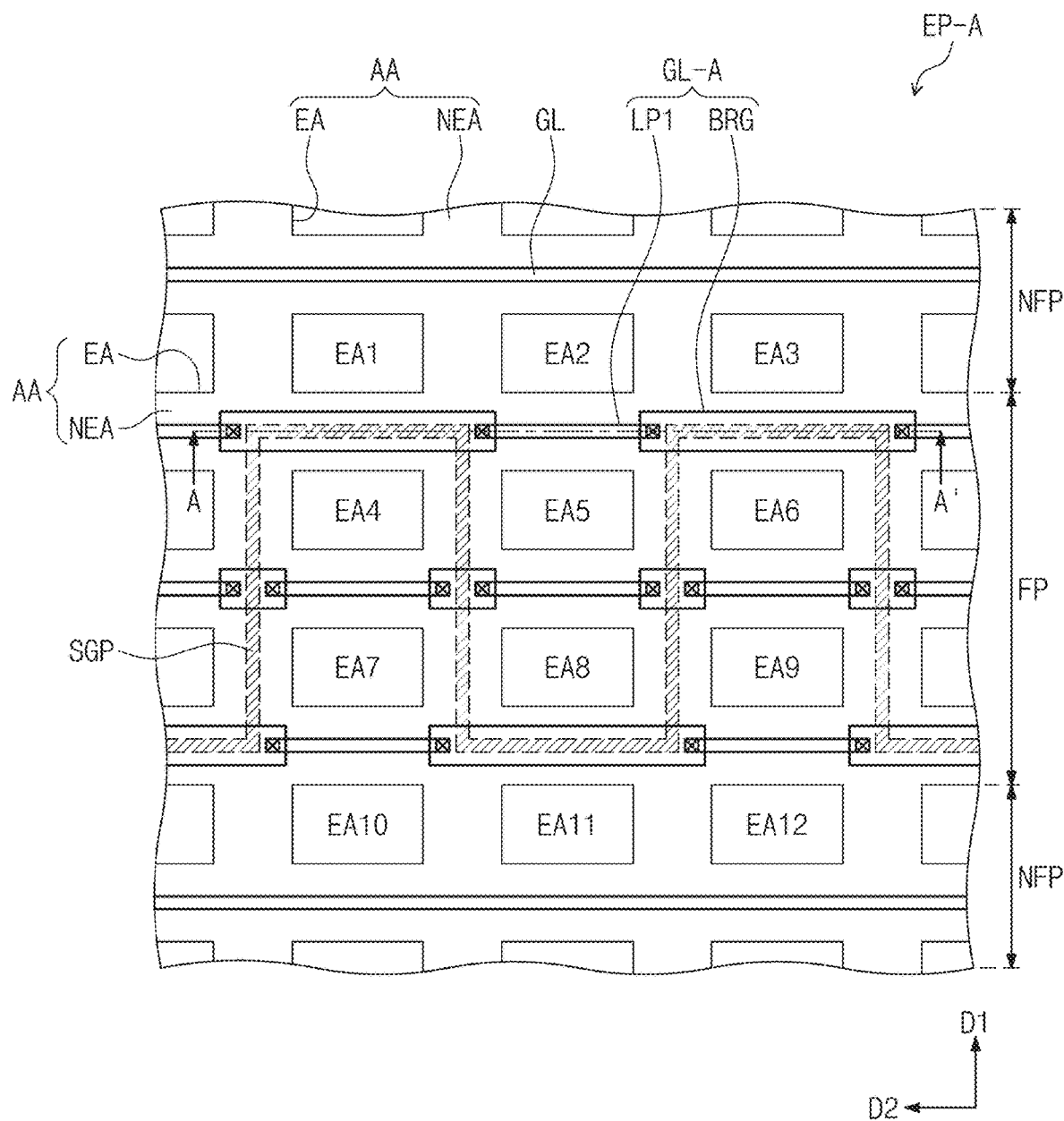
FIG. 7A is a plan view schematically illustrating a portion of an electronic panel according to an embodiment of the invention.
Figure 7B:
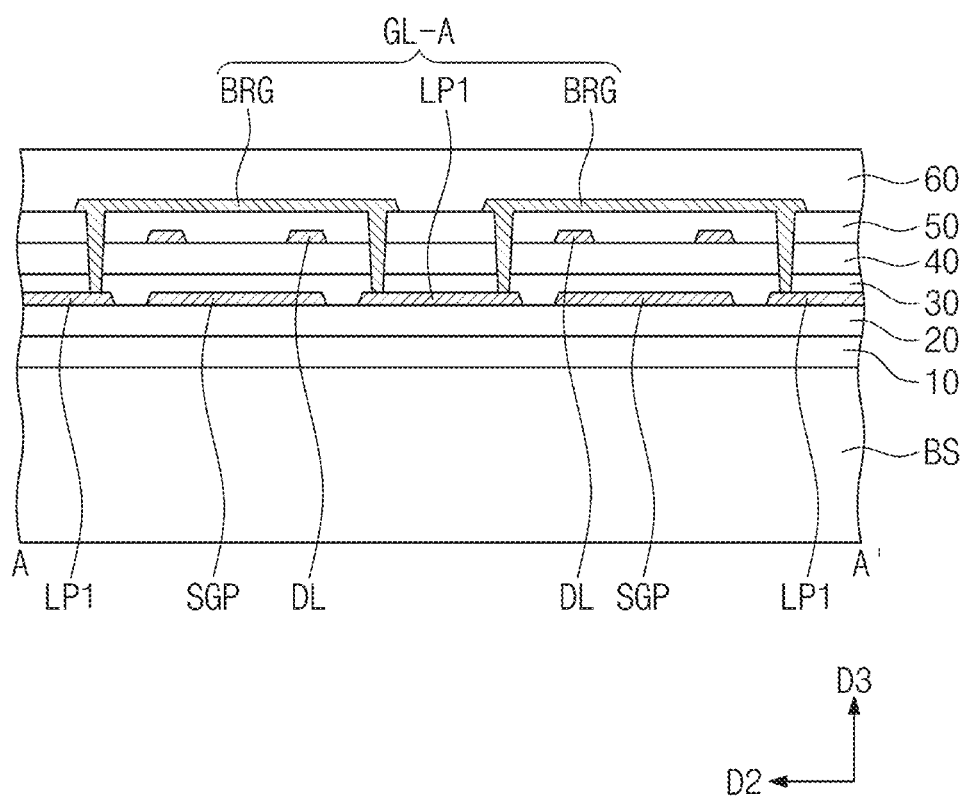
FIG. 7B is a sectional view taken along line A-A' of FIG. 7A.
Figure 8A:
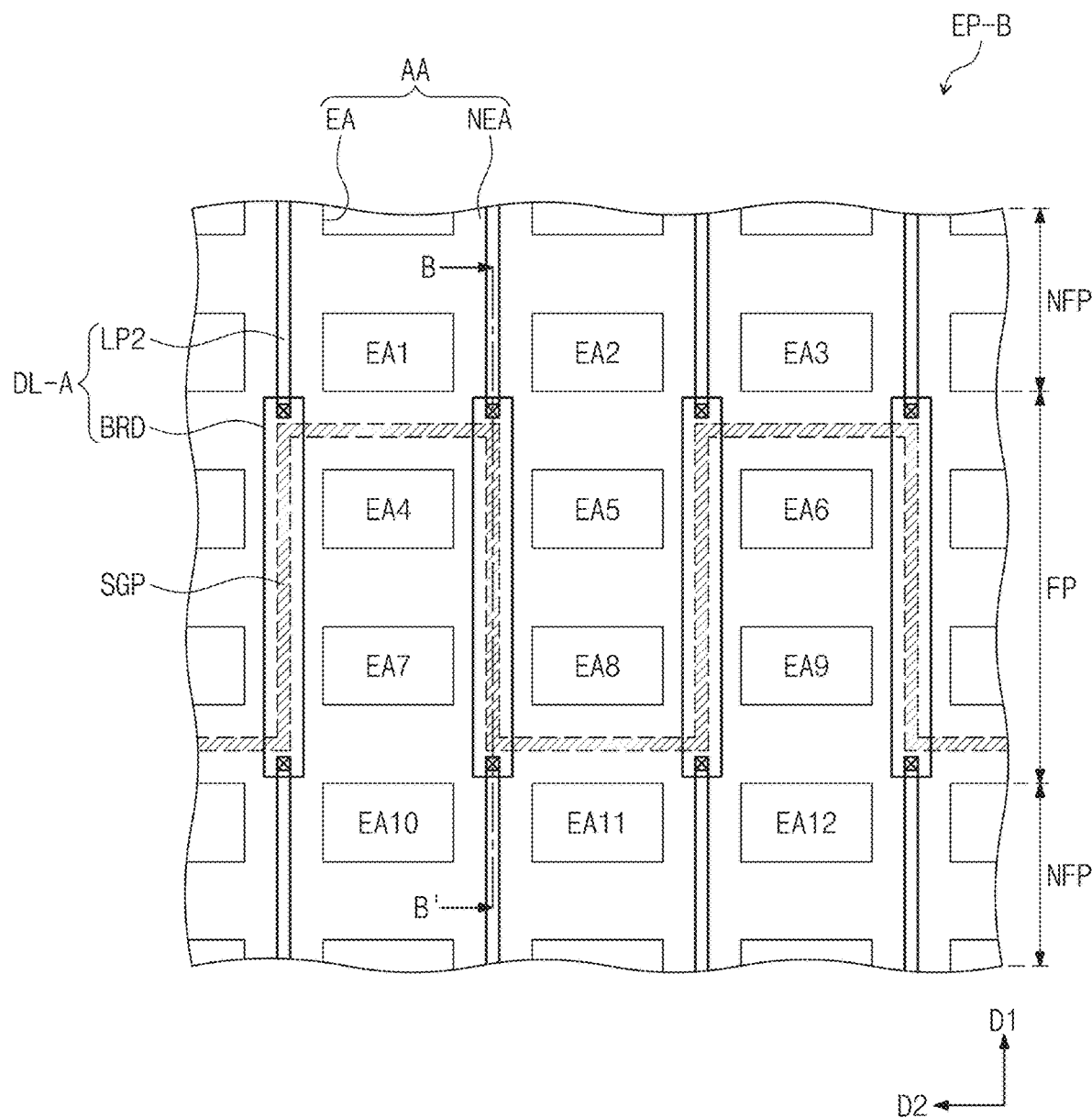
FIG. 8A is a plan view schematically illustrating a portion of an electronic panel according to an alternative embodiment of the invention.
Figure 8B:
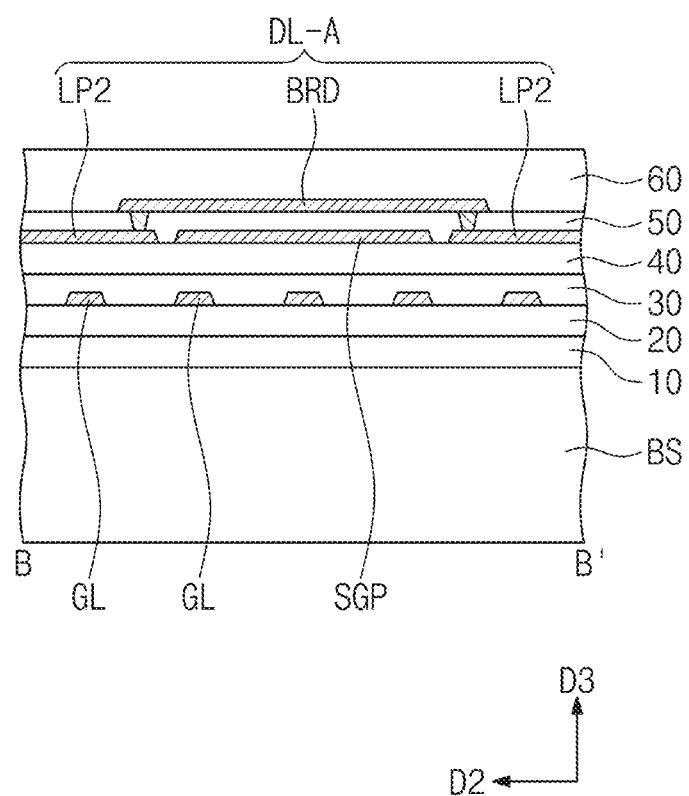
FIG. 8B is a sectional view taken along line B-B' of FIG. 8A.

FIG. 7A is a plan view schematically illustrating a portion of an electronic panel according to an embodiment of the invention, and FIG. 7B is a sectional view taken along line A-A' of FIG. 7A. FIG. 8A is a plan view schematically illustrating a portion of an electronic panel according to an alternative embodiment of the invention, and FIG. 8B is a sectional view taken along line B-B' of FIG. 8A. FIGS. 7A and 8A illustrate a region corresponding to the region shown in FIG. 6A, and for convenience in illustration, some elements are omitted from FIGS. 7A to 8B. Hereinafter, an embodiment of the invention will be described with reference to FIGS. 7A to 8B.

Referring to FIGS. 7A and 7B, in an embodiment, the strain-sensing pattern SGP may be disposed on the folding part FP. In such an embodiment, the strain-sensing pattern SGP is illustrated to have a shape corresponding to the strain-sensing pattern SGP of FIG. 6A. In such an embodiment, the strain-sensing pattern SGP may be disposed at a same level or in a same layer as a gate line GL or GL-A. In FIG. 7A, the strain-sensing pattern SGP is illustrated, along with the gate lines GL and GL-A.

An electronic panel EP-A may include a gate line GL, which is disposed on the planar part NFP, and a gate line GL-A (hereinafter, a folding gate line), which is disposed on the folding part FP. The gate line GL and the folding gate line GL-A may be designed to have different structures from each other.

In one embodiment, for example, the gate line GL may be a line-shaped pattern extending in the second direction D2. In an embodiment, the folding gate line GL-A may include a plurality of patterns, which are connected to each other. In one embodiment, for example, the folding gate line GL-A may include a plurality of first line patterns LP1 and a plurality of first connection patterns BRG.

The first line patterns LP1 may extend in the second direction D2 and may be spaced apart from each other in the second direction D2. The first line patterns LP1 may be disposed at a same level or in a same layer as the strain-sensing pattern SGP. The first line patterns LP1 may overlap the folding part FP and may be spaced apart from the strain-sensing pattern SGP. Thus, the first line patterns LP1 may be electrically disconnected from the strain-sensing pattern SGP.

The first connection patterns BRG may extend in the second direction D2 and may be spaced apart from each other in the second direction D2. Each of the first connection patterns BRG may connect adjacent ones of the first line patterns LP1 to each other. The first connection patterns BRG may overlap the strain-sensing pattern SGP.

The first connection patterns BRG may be disposed at a different level or in a different layer from the strain-sensing pattern SGP. In such an embodiment, the first connection patterns BRG may be disposed between the fifth insulating layer 50 and the sixth insulating layer 60. The first connection patterns BRG may penetrate or be disposed through the third to fifth insulating layers 30, 40, and 50 and may be connected to the first line patterns LP1. Thus, adjacent patterns of the first line patterns LP1 may be electrically connected to each other through the first connection patterns BRG.

In such an embodiment, data lines DL may be disposed between the fourth insulating layer 40 and the fifth insulating layer 50. The first connection patterns BRG may be disposed at a different level or in a different layer from the data lines DL. Thus, the first line patterns LP1 may be electrically disconnected from the data lines DL and the strain-sensing pattern SGP. According to an embodiment of the invention, since the electronic panel EP-A includes the folding gate line GL-A, even when the folding gate line GL-A is disposed at a same level or in a same layer as the strain-sensing pattern SGP, gate signals may be stably provided to pixels on the folding part FP. The strain-sensing pattern SGP may be electrically disconnected from the gate lines GL and GL-A and may stably sense a folding stress in the folding part FP.

Referring to FIGS. 8A and 8B, an electronic panel EP-B may include data lines DL-A. The data lines DL-A may overlap the folding part FP. Each of the data lines DL-A may include a plurality of second line patterns LP2 and a second connection pattern BRD.

The second line patterns LP2 may extend in the first direction D1 and may be spaced apart from each other in the first direction D1. The second line patterns LP2 may be disposed at a same level or in a same layer as the strain-sensing pattern SGP. The second line patterns LP2 may be disposed between the fourth insulating layer 40 and the fifth insulating layer 50 and may be spaced apart from the strain-sensing pattern SGP.

The second connection pattern BRD may extend in the first direction D1 to connect adjacent ones of the second line patterns LP2 to each other. The second connection pattern BRD may overlap the strain-sensing pattern SGP, when viewed in a plan view. The second connection pattern BRD may be disposed at a different level or in a different layer from the second line patterns LP2 and the strain-sensing pattern SGP.

In such an embodiment, the second connection pattern BRD may be disposed between the fifth insulating layer 50 and the sixth insulating layer 60. As shown in FIG. 8B, the gate lines GL may be spaced apart from each other between the second insulating layer 20 and the third insulating layer 30 and may cross the data lines DL-A. The second connection pattern BRD may penetrate or be disposed through the fifth insulating layer 50 and may be connected to the second line patterns LP2. Thus, the second line patterns LP2, which are spaced apart from each other, may be electrically connected to each other through the second connection pattern BRD and may be used for a stable transmission of data signals.

According to an embodiment of the invention, since the electronic panel EP-B includes the data lines DL-A, the strain-sensing pattern SGP may be disposed or formed at a same level or in a same layer as the second line patterns LP2. According to an embodiment of the invention, the strain-sensing pattern SGP may be electrically disconnected from the data lines DL-A and may stably sense a folding stress in the folding part FP.

Figure 9A:
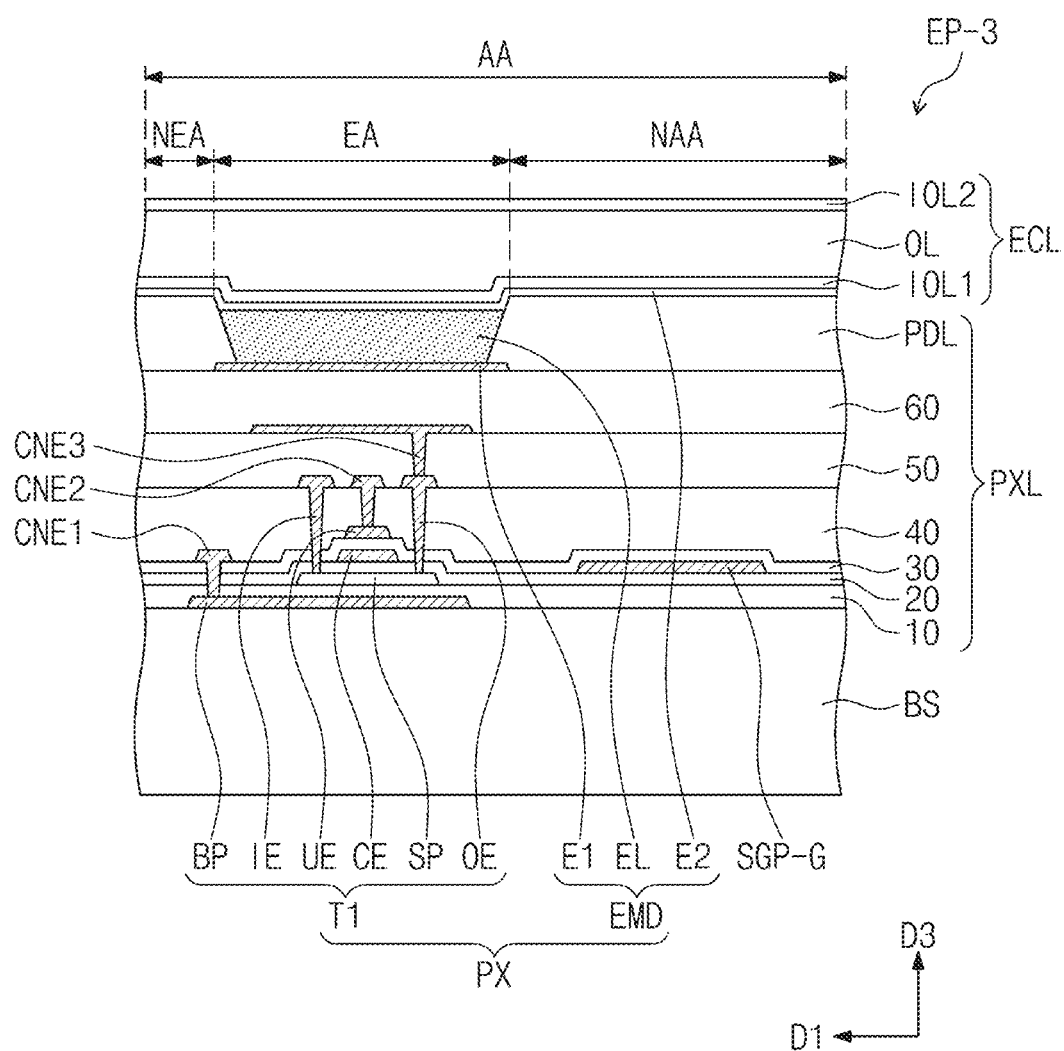
FIGS. 9A to 9C are sectional views each illustrating an electronic panel according to an embodiment of the invention.
Figure 9B:
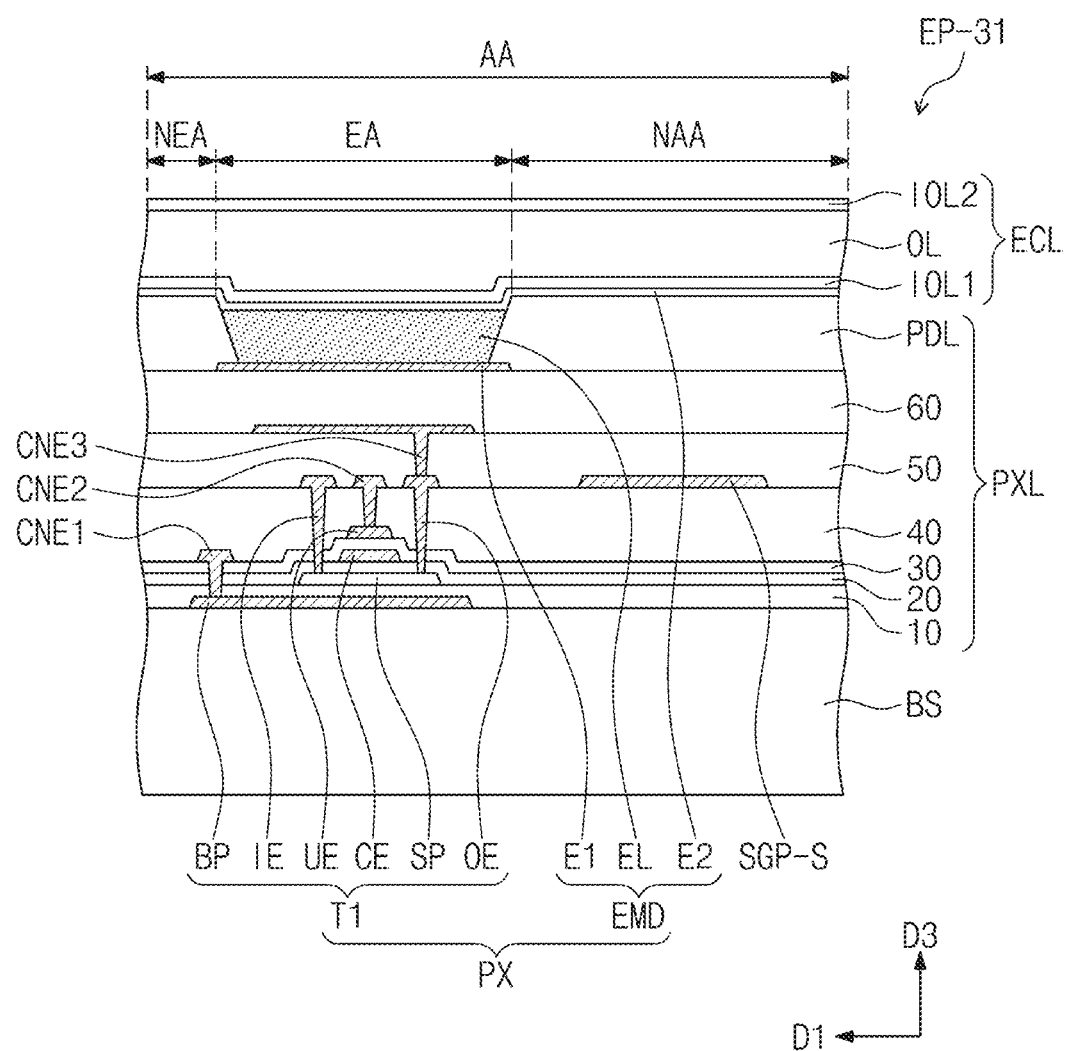
Figure 9C:
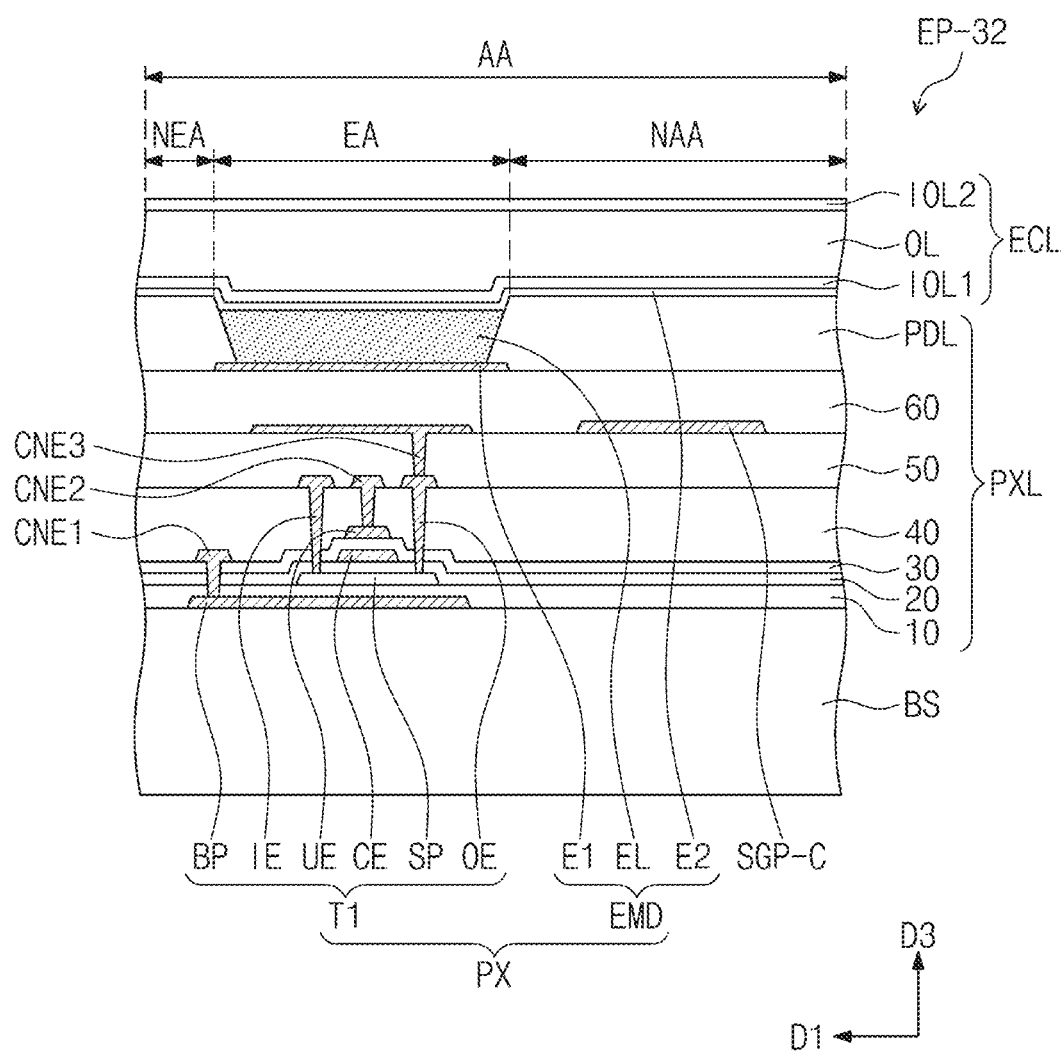

FIGS. 9A to 9C are sectional views each illustrating an electronic panel according to an embodiment of the invention. For convenience in illustration, FIGS. 9A to 9C illustrate regions corresponding to the region shown in FIG. 4A. Hereinafter, an embodiment of the invention will be described with reference to FIGS. 9A to 9C. For concise description, a same or like element previously described with reference to FIGS. 1 to 6B may be identified by the same reference number and any repetitive detailed description thereof will be omitted.

As shown in FIG. 9A, in an embodiment of an electronic panel EP-3, a strain-sensing pattern SGP-G may be disposed at a same level or in a same layer as the control electrode CE. The strain-sensing pattern SGP-G may be disposed between the second insulating layer 20 and the third insulating layer 30 and may be spaced apart from the control electrode CE.

In such an embodiment, the strain-sensing pattern SGP-G may be formed of or include a same material as the control electrode CE. In an embodiment, the strain-sensing pattern SGP-G and the control electrode CE may be simultaneously patterned using a single mask such that the fabrication process is simplified and the fabrication cost is reduced.

As shown in FIG. 9B, in an alternative embodiment of an electronic panel EP-31, a strain-sensing pattern SGP-S may be disposed at a same level or in a same layer as the input electrode IE or the output electrode OE. The strain-sensing pattern SGP-S may be disposed between the fourth insulating layer 40 and the fifth insulating layer 50 and may be spaced apart from the input electrode IE and the output electrode OE.

In such an embodiment, the strain-sensing pattern SGP-S may be formed of or include a same material as the input electrode IE and the output electrode OE. In an embodiment, the strain-sensing pattern SGP-S and the input and output electrodes IE and OE may be simultaneously patterned using a single mask, such that the fabrication process is simplified and the fabrication cost is reduced.

As shown in FIG. 9C, in another alternative embodiment of an electronic panel EP-32, a strain-sensing pattern SGP-C may be disposed at a same level or in a same layer as the third connection electrode CNE3. The strain-sensing pattern SGP-C may be disposed between the fifth insulating layer 50 and the sixth insulating layer 60 and may be spaced apart from the third connection electrode CNE3. In such an embodiment, the strain-sensing pattern SGP-C may include or be formed of a same material as the third connection electrode CNE3. In an embodiment, the strain-sensing pattern SGP-C and the third connection electrode CNE3 may be simultaneously patterned using a single mask such that the fabrication process is simplified and the fabrication cost is reduced.

Alternatively, although not shown, the strain-sensing pattern may be disposed at a same level or in a same layer as the upper electrode UE or the first electrode E1. According to an embodiment of the invention, the strain-sensing pattern SGP-G, SGP-S, or SGP-C may be disposed at a same level or in a same layer as conductive patterns constituting the pixel layer PXL. Thus, the strain-sensing pattern SGP-G, SGP-S, or SGP-C may be formed without an additional layer or an additional process, such that a fabrication process is simplified and the fabrication cost is reduced.

FIGS. 10A to 10D are plan views each illustrating an electronic panel according to an embodiment of the invention. The folding part FP are depicted as a shaded region, and for convenience in illustration, some elements are omitted from FIGS. 10A to 10D.

Hereinafter, an embodiment of the invention will be described with reference to FIGS. 10A to 10D. For concise description, a same or like element previously described with reference to FIGS. 1A to 9C may be identified by the same reference number and any repetitive detailed description thereof will be omitted.

Figure 10A:
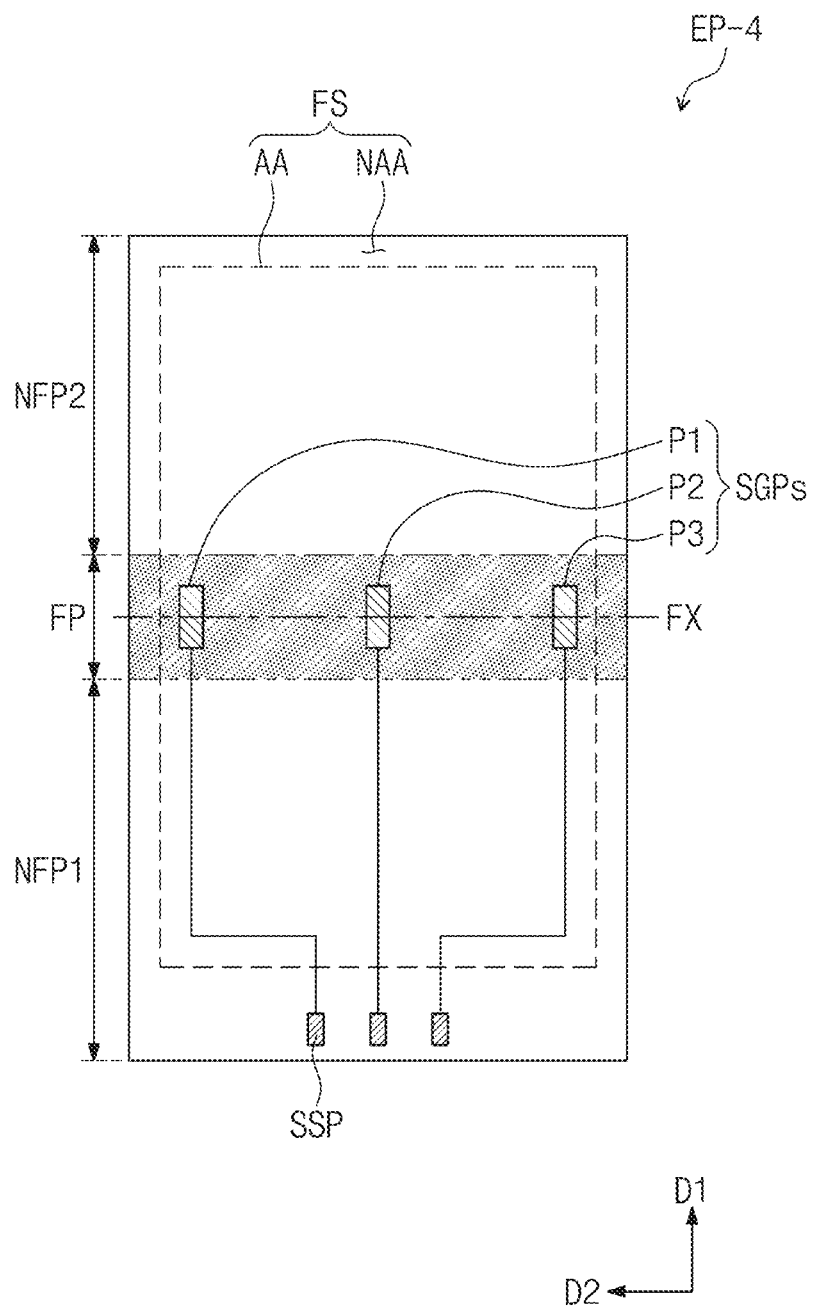
FIGS. 10A to 10D are plan views each illustrating an electronic panel according to an embodiment of the invention.

As shown in FIG. 10A, an embodiment of an electronic panel EP-4 may include a plurality of strain-sensing patterns SGPs. In such an embodiment, a first pattern P1, a second pattern P2, and a third pattern P3 of the strain-sensing patterns SGPs are exemplarily illustrated.

The first pattern P1, the second pattern P2, and the third pattern P3 may be arranged in an extension direction of the folding axis FX. In such an embodiment, the first pattern P1, the second pattern P2, and the third pattern P3 may be spaced apart from each other in the second direction D2. As described above, each of the first pattern P1, the second pattern P2, and the third pattern P3 is illustrated to be connected to one of the pads SSP, for convenience in illustration, but may be connected to a plurality of pads.

Figure 10B:
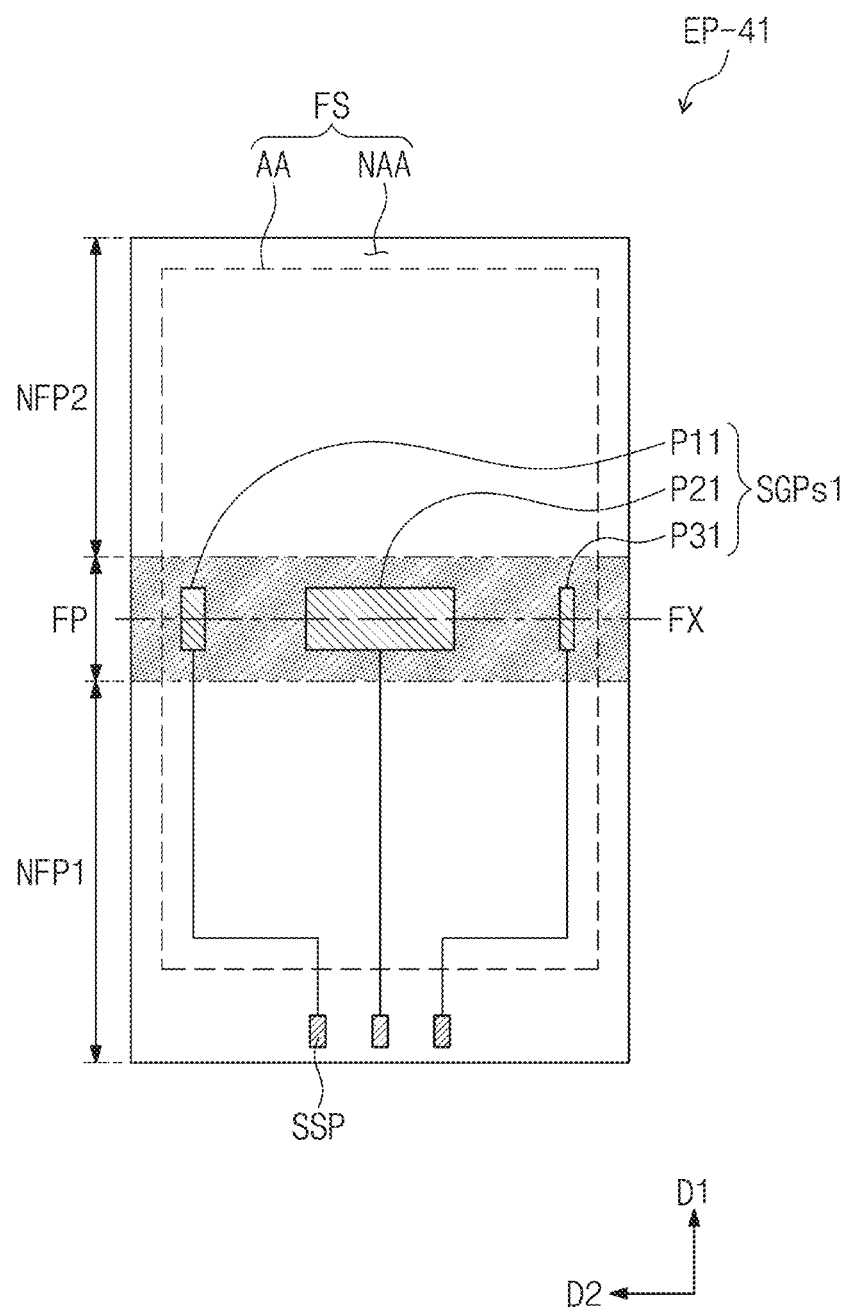

As shown in FIG. 10B, in an alternative embodiment of an electronic panel EP-41, strain-sensing patterns SGPs1 may include a first pattern P11, a second pattern P21, and a third pattern P31, whose shapes are different from each other. In such an embodiment, the second pattern P21 at a center region is illustrated to have a relatively large area, and the first pattern P11 and the third pattern P31 at edge regions are illustrated to have a relatively small area. In such an embodiment, the first pattern P11 and the third pattern P31 may have different areas from each other. However, the invention is not limited thereto, and in an alternative embodiment, the second pattern P21 may have a relatively small area, compared with the first pattern P11 or the third pattern P31.

Figure 10C:
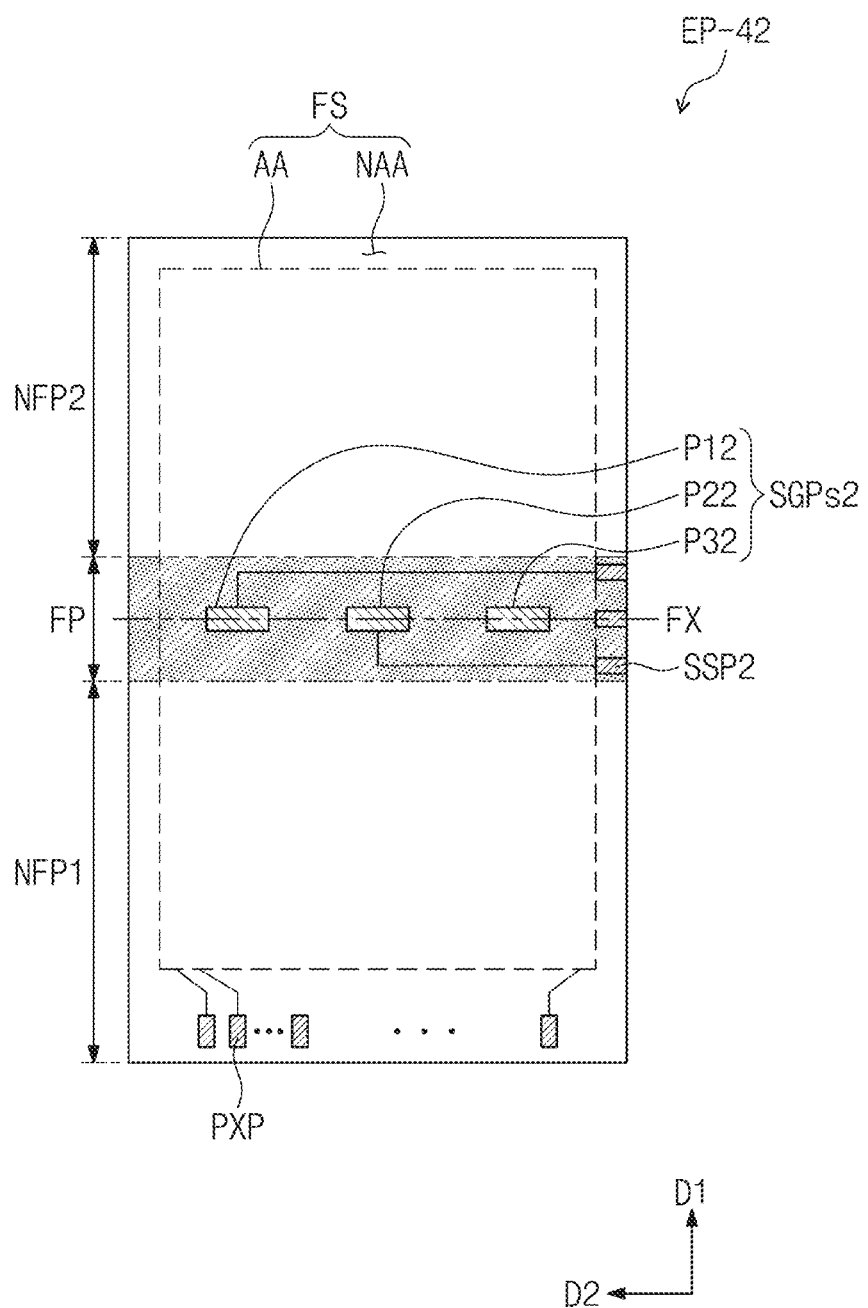

As shown in FIG. 10C, in another alternative embodiment of an electronic panel EP-42, strain-sensing patterns SGPs2 may be connected to strain-sensing pads SSP2, which are disposed in a region different from the pixel pads PXP. In such an embodiment, the strain-sensing patterns SGPs2 may have a shape extending in the second direction D2 and may include a first pattern P12, a second pattern P22, and a third pattern P32 arranged in the second direction D2.

The strain-sensing pads SSP2 may be disposed on a region of the peripheral region NAA overlapping the folding part FP. Thus, the strain-sensing pads SSP2 may be spaced apart from the pixel pads PXP, which are disposed on the planar part NFP1, in the first direction D1. Strain sensing lines may extend in the second direction D2 and may connect the strain-sensing patterns SGPs2 to the strain-sensing pads SSP2.

Figure 10D:
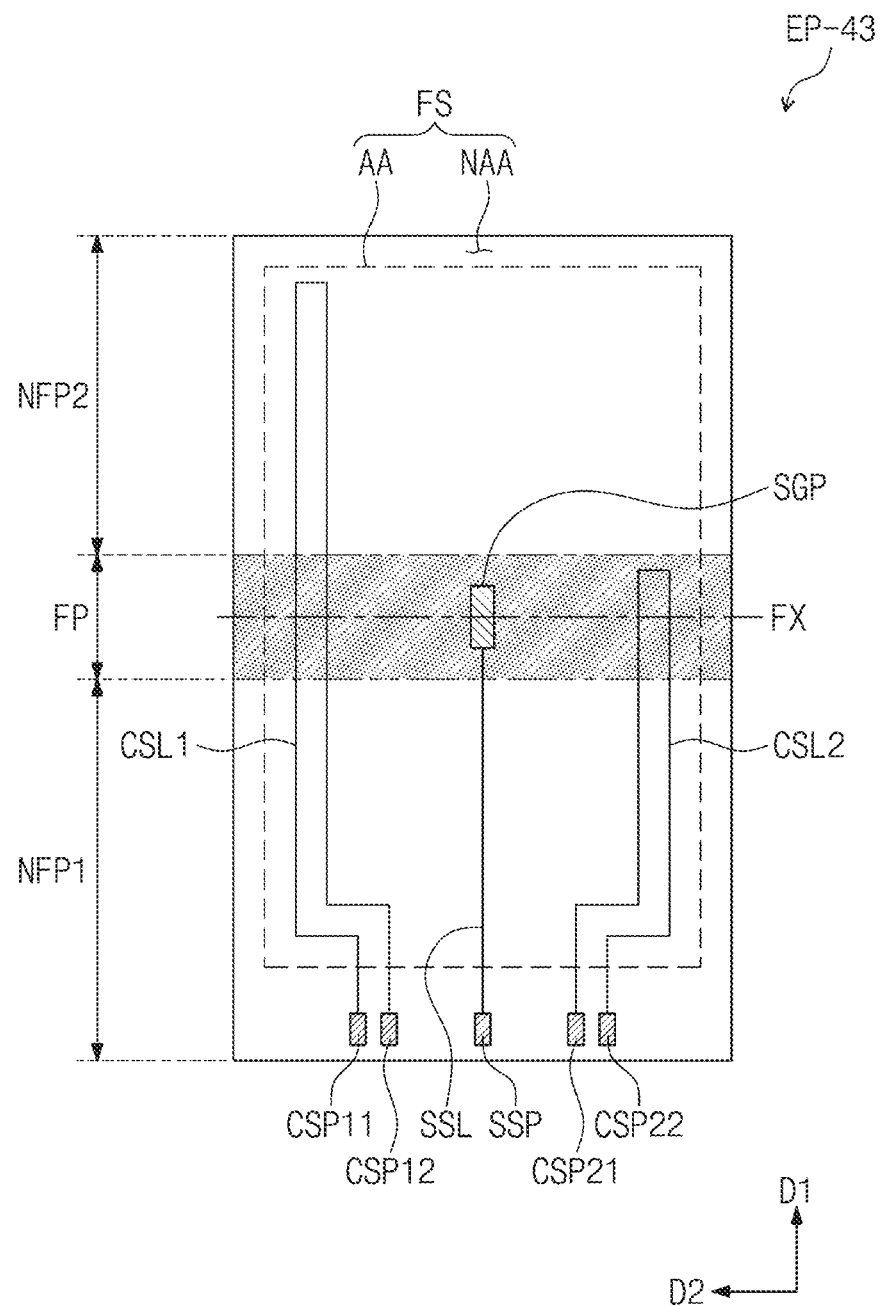

Alternatively, as shown in FIG. 10D, an electronic panel EP-43 may further include a crack-sensing sensor. The crack-sensing sensor may sense a crack, which may occur in the electronic panel EP-43. The crack-sensing sensor may include a plurality of crack-sensing lines CSL1 and CSL2 and a plurality of crack-sensing pads CSP11, CSP12, CSP21 and CSP22 such that the presence or absence of the crack and the position of the crack may be effectively sensed. However, the invention is not limited thereto, and in an embodiment, the crack-sensing lines CSL1 and CSL2 may be provided as a single object or be integrally formed as a single unitary and indivisible unit.

Each of the crack-sensing lines CSL1 and CSL2 may be a single line. In one embodiment, for example, a first crack-sensing line CSL1 of the crack-sensing lines CSL1 and CSL2 may be a line, which extends to the second planar part NFP2 through the first planar part NFP1 and the folding part FP and backwardly extends to pass the folding part FP and the first planar part NFP1, and may have two opposite ends, which are connected to a first input crack-sensing pad CSP11 and a first output crack-sensing pad CSP12, respectively. In such an embodiment, a second crack-sensing line CSL2 of the crack-sensing lines CSL1 and CSL2 may be a line, which extends to the folding part FP through the first planar part NFP1 and backwardly extends to pass through the first planar part NFP1, and may have two opposite ends, which are connected to a second input crack-sensing pads CSP21 and a second output crack-sensing pad CSP22, respectively.

The crack-sensing lines CSL1 and CSL2 may be spaced apart from each other, in the second direction D2, with the strain-sensing pattern SGP interposed therebetween. In such an embodiment, the crack-sensing lines CSL1 and CSL2 may be disposed at a same level or in a same layer as the strain-sensing pattern SGP. In an embodiment where the crack-sensing lines CSL1 and CSL2 includes or are formed of a same material as the strain-sensing pattern SGP, the crack-sensing lines CSL1 and CSL2 and the strain-sensing pattern SGP may be simultaneously formed using a single mask such that a fabrication process is simplified and the fabrication cost is reduced.

According to an embodiment of the invention, the electronic panel EP-43 may sense a folding state thereof (e.g., on whether and how much it is folded) and may easily sense damage of the electronic panel EP-43, which may be caused by a folding stress. However, the invention is not limited thereto, and in an alternative embodiment, positions of the crack-sensing lines CSL1 and CSL2 may be variously modified as long as the crack-sensing lines CSL1 and CSL2 are disposed on the front surface FS.

Figure 11A:
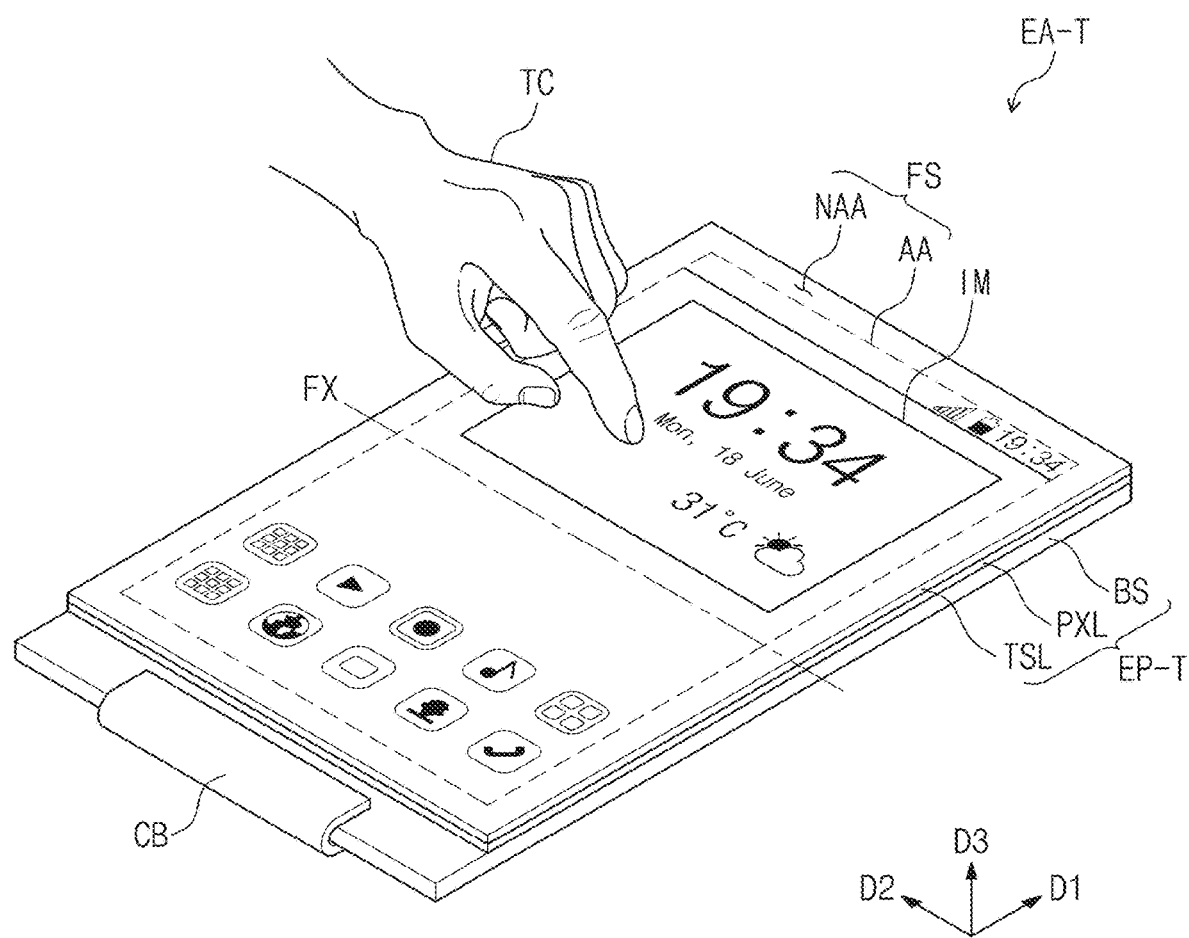
FIG. 11A is a perspective view illustrating an electronic apparatus according to an embodiment of the invention.
Figure 11B:
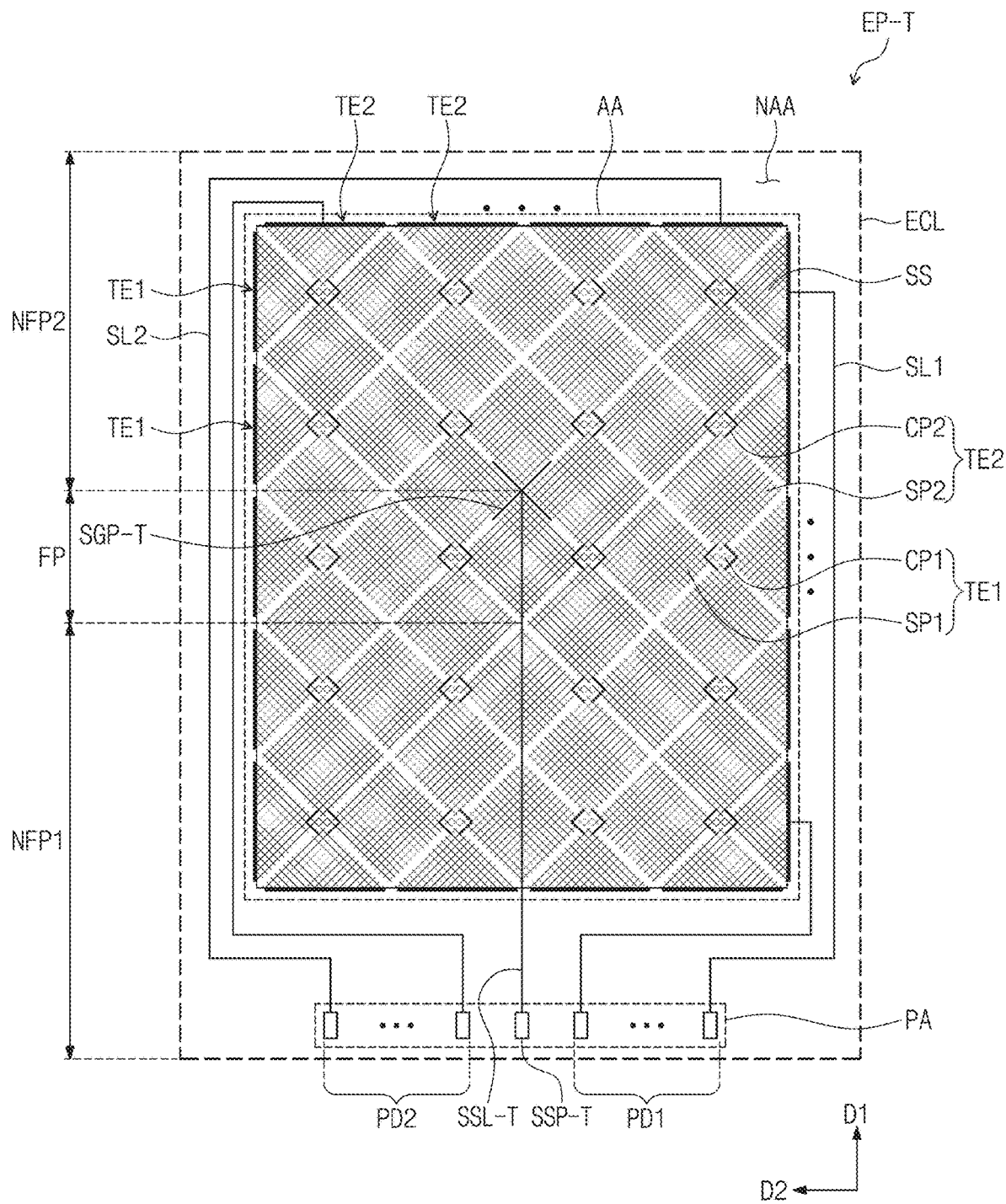
FIG. 11B is a plan view illustrating an electronic panel according to an embodiment of the invention.
Figure 11C:
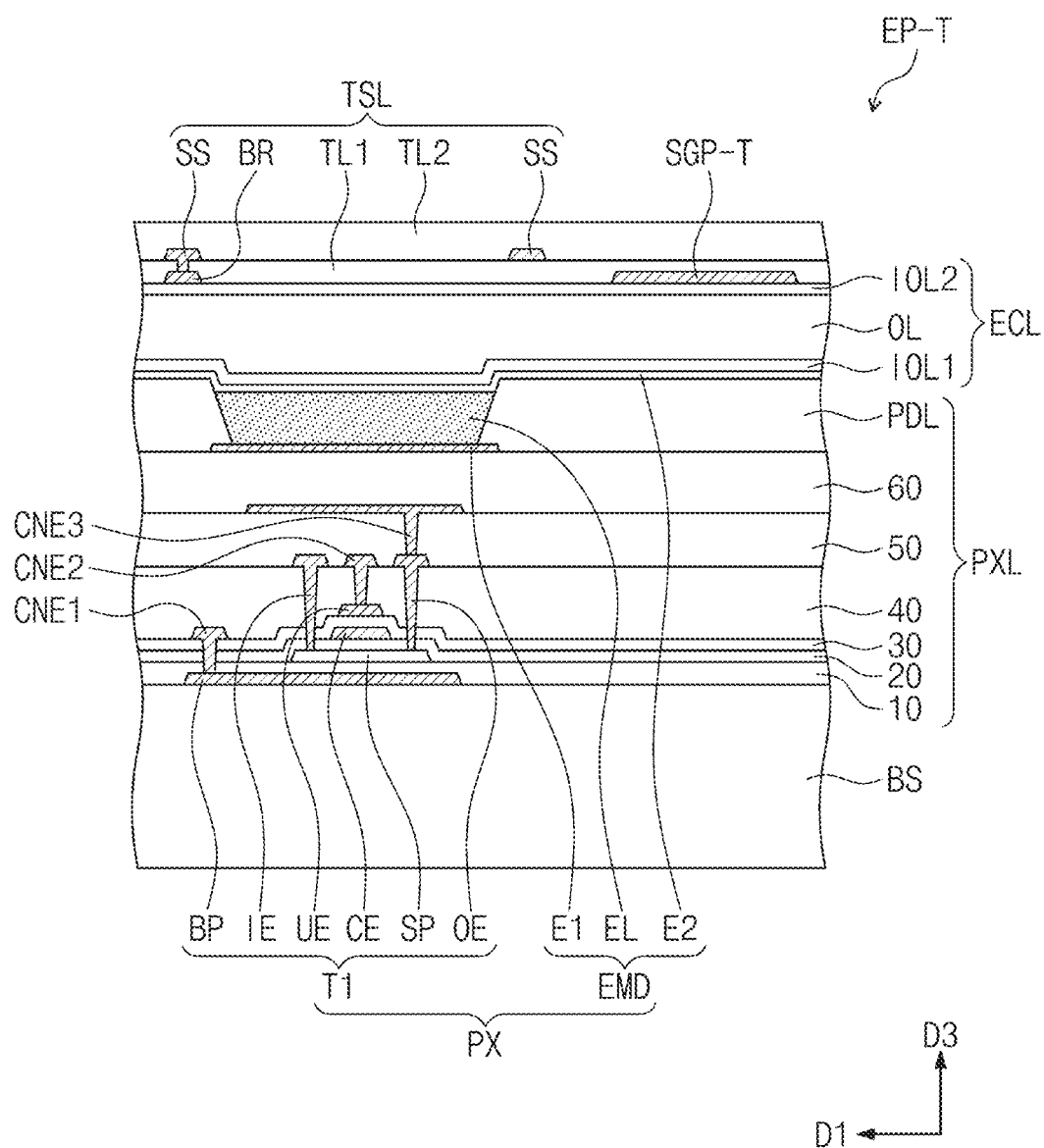
FIG. 11C is a sectional view illustrating a region of an electronic panel according to an embodiment of the invention.

FIG. 11A is a perspective view illustrating an electronic apparatus according to an embodiment of the invention. FIG. 11B is a plan view illustrating an electronic panel according to an embodiment of the invention. FIG. 11C is a sectional view illustrating a region of an electronic panel according to an embodiment of the invention. For convenience in illustration, some elements are omitted from FIG. 11B, and FIG. 11C illustrates a region corresponding to the region shown in FIG. 4A. Hereinafter, an embodiment of the invention will be described with reference to FIGS. 11A to 11C. For concise description, a same or like element previously described with reference to FIGS. 1 to 10D may be identified by the same reference number and any repetitive detailed description thereof will be omitted.

As shown in FIG. 11A, an embodiment of an electronic apparatus EA-T may display the image IM on the front surface FS and may sense a touch TC to be exerted on the front surface FS from the outside. The electronic apparatus EA-T may be folded along the folding axis FX extending in the second direction D2. The electronic apparatus EA-T shown in FIG. 11A may be substantially the same as the electronic apparatus EA of FIG. 1 and any repetitive detailed description of the same or like elements thereof will be omitted.

The electronic apparatus EA-T may sense various types of touch. In one embodiment, for example, the touch TC may include various types of an external input, such as a part of a user's body, light, heat, or pressure. In an embodiment, the electronic apparatus EA may sense an input that is in contact therewith or close thereto. In such an embodiment, the touch TC may be a user's hand, as shown in FIG. 11A.

The electronic apparatus EA-T may further include an electronic panel EP-T, in addition to the circuit board CB. The circuit board CB may transmit or receive an electrical signal activating the active region AA of the electronic panel EP-T to sense the external touch TC. In one embodiment, for example, the circuit board CB may transmit or receive an electrical signal for displaying the image IM and for sensing the touch TC. However, the invention is not limited thereto, and in an embodiment, the electronic panel EP-T may further include an additional circuit board, which is independently provided to sense the touch TC.

Referring to FIGS. 11A to 11C, the electronic panel EP-T may include a touch-sensing layer TSL, in addition to the base substrate BS, the pixel layer PXL, and the encapsulation layer ECL. The touch-sensing layer TSL may be disposed on the encapsulation layer ECL. The base substrate BS, the pixel layer PXL, and the encapsulation layer ECL may be configured to be substantially the same as the corresponding ones shown in FIG. 4A, and thus, any repetitive detailed description thereof will be omitted. In FIG. 11B, the encapsulation layer ECL is depicted by a dotted line, for convenience in illustration.

Referring to FIG. 11B, a first sensing electrode TE1, a second sensing electrode TE2, a first signal line SL1, a second signal line SL2, a first pad PD1, a second pad PD2, a strain-sensing pattern SGP-T, a strain-sensing line SSL-T, and a strain-sensing pad SSP-T may be disposed on the encapsulation layer ECL.

The first sensing electrode TE1 may extend in the second direction D2. In an embodiment, a plurality of the first sensing electrode TE1 may be arranged in the first direction D1. The first sensing electrode TE1 may include a plurality of first sensor patterns SP1, which are arranged in the second direction D2, and a plurality of first connection patterns CP1, which are disposed between the first sensor patterns SP1 to connect adjacent patterns of the first sensor patterns SP1 to each other.

The second sensing electrode TE2 may be disposed to be electrically disconnected from the first sensing electrode TEL The second sensing electrode TE2 may extend in the first direction D1. In an embodiment, a plurality of the second sensing electrodes TE2 may be arranged in the second direction D2. The second sensing electrode TE2 may include a plurality of second sensor patterns SP2, which are arranged in the first direction D1, and a plurality of second connection patterns CP2, which are disposed between the second sensor patterns SP2 to connect adjacent patterns of the second sensor patterns SP2 to each other.

The touch-sensing layer TSL may sense a change in mutual capacitance between the first sensing electrode TE1 and the second sensing electrode TE2 or may sense a change in self capacitance of each of the first sensing electrode TE1 and the second sensing electrode TE2 to sense an external input TC (e.g., the touch event shown in FIG. 11A). A method of sensing the external input TC using the touch-sensing layer TSL may be variously modified, and the invention is not limited to a specific embodiment.

Referring to FIG. 11C, each of the first sensor pattern SP1 and the second sensor pattern SP2 may include a plurality of mesh patterns SS. The mesh patterns SS may be patterns, which intersect each other in the first and second directions D1 and D2 and form a net-shaped structure. Since the mesh patterns SS are flexible, the touch-sensing layer TSL may be effectively prevented from being damaged by a folding operation of the electronic apparatus EA-T.

In an embodiment, the first connection pattern CP1 may be disposed at a same level or in a same layer as the mesh patterns SS, and the second connection pattern CP2 may be disposed at a different level or in a different layer from the mesh patterns SS. In one embodiment, for example, the first connection pattern CP1 may be defined by or composed of the mesh patterns SS disposed between a first touch insulating layer TL1 and a second touch insulating layer TL2, and the second connection pattern CP2 may be defined by or composed of a bridge pattern BR disposed between the first touch insulating layer TL1 and the encapsulation layer ECL. Thus, the first connection pattern CP1 and the second connection pattern CP2 may be effectively prevented from forming a short circuit and may be stably connected to the first sensor pattern SP1 and the second sensor pattern SP2, respectively. However, the invention is not limited thereto. In an alternative embodiment, a stacking structure of the second connection pattern CP2 and the first connection pattern CP1 may be variously modified, and the second connection pattern CP2 may be defined by or composed of the mesh patterns.

The first signal line SL1 may be connected to the first sensing electrode TEL The first signal line SL1 may be disposed on the peripheral region NAA and may not be recognized by a user. The second signal line SL2 may be connected to the second sensing electrode TE2. The second signal line SL2 may also be disposed on the peripheral region NAA and may not be recognized by a user.

In such an embodiment, the second signal line SL2 may be connected to an end of the second sensing electrode TE2 and may be connected to the second pad PD2 through the second sensing electrode TE2. However, the invention is not limited thereto, and in an embodiment, the touch-sensing layer TSL may further include a signal line, which is connected to an opposite end of the second sensing electrode TE2 and is connected to an additional pad. Thus, even when the second sensing electrode TE2 is longer than the first sensing electrode TE1, an electrical signal may be uniformly applied to the entire region of the active region AA. Accordingly, regardless of the shape of the touch-sensing layer TSL such that a uniform touch-sensing environment may be provided throughout the entire region of the active region AA.

However, the invention is not limited thereto, and in an alternative embodiment, opposite ends of the first sensing electrode TE1 may be connected to two signal lines. According to an embodiment of the invention, the touch-sensing layer TSL may be operated in various manners, and the invention is not limited to a specific embodiment.

Each of the first and second pads PD1 and PD2 may be electrically connected to the first or second sensing electrode TE1 or TE2 through a corresponding one of the first and second signal lines SL1 and SL2. Electrical signals from the outside may be applied to the touch-sensing layer TSL through the first and second pads PD1 and PD2.

The mesh pattern SS may be disposed between the first touch insulating layer TL1 and the second touch insulating layer TL2. The mesh pattern SS may not overlap the light emitting layer EL, when viewed in a plan view. A portion of the mesh pattern SS may penetrate or be disposed through the first touch insulating layer TL1 and may be connected to the bridge pattern BR. In such an embodiment, each of the first or second sensing electrodes TE1 and TE2 includes the mesh patterns. Accordingly, in such an embodiment, the touch-sensing layer TSL may be easily or effectively folded along the folding axis FX. However, the invention is not limited thereto, and in an alternative embodiment, the first sensing electrode TE1 or the second sensing electrode TE2 may include a transparent electrode and may overlap the light emitting layer EL in a plan view.

In an embodiment of the electronic panel EP-T, the strain-sensing pattern SGP-T may be disposed in the touch-sensing layer TSL. In one embodiment, for example, the strain-sensing pattern SGP-T may be disposed at a same level or in a same layer as the mesh pattern SS. The strain-sensing pattern SGP-T may be disposed between first touch insulating layer TL1 and the second touch insulating layer TL2.

The strain-sensing pattern SGP-T may be disposed between the first sensor pattern SP1 and the second sensor pattern SP2 and may be spaced apart from the first sensor pattern SP1 and the second sensor pattern SP2, when viewed in a plan view. The strain-sensing pattern SGP-T may be electrically disconnected from the first sensor pattern SP1 and the second sensor pattern SP2. In such an embodiment, the strain-sensing pattern SGP-T may have a letter "X" shape having four portions, each of which is inclined to both of the first and second directions D1 and D2. However, the invention is not limited thereto, and in an alternative embodiment, the strain-sensing pattern SGP-T may have various shapes, as long as the first sensor pattern SP1 and the second sensor pattern SP2 are spaced apart from each other.

The strain-sensing pattern SGP-T may overlap the folding part FP. In such an embodiment, the strain-sensing pattern SGP-T may partially overlap the folding part FP. In one embodiment, for example, the strain-sensing pattern SGP-T may overlap both of the folding part FP and the first planar part NFP1. In such an embodiment, the strain-sensing pattern SGP-T may overlap a border between the folding part FP and the first planar part NFP1. Accordingly, even when the strain-sensing pattern SGP-T partially overlaps the folding part FP, deformation of the folding part FP may be effectively sensed. However, the invention is not limited thereto, and in an alternative embodiment, the strain-sensing pattern SGP-T may overlap only the folding part FP.

The strain-sensing pattern SGP-T may include or be formed of a same material as the mesh pattern SS. In an embodiment, the strain-sensing pattern SGP-T and the mesh pattern SS may be simultaneously formed by a single mask, such that the fabrication process may be simplified and the fabrication cost may be reduced.

The strain-sensing line SSL-T may connect the strain-sensing pattern SGP-T to the strain-sensing pad SSP-T. The strain-sensing line SSL-T may be disposed at a different level or in a different layer from the strain-sensing pattern SGP-T. In such an embodiment, the strain-sensing line SSL-T may be disposed at the same level or in a same layer as the bridge pattern BR. In an embodiment, the strain-sensing line SSL-T may include or be formed of a same material as the bridge pattern BR, and the strain-sensing line SSL-T and the bridge pattern BR may be simultaneously formed using a single mask.

The strain-sensing pattern SGP-T may penetrate or be disposed through the first touch insulating layer TL1 and may be connected to the strain-sensing line SSL-T. The strain-sensing pattern SGP-T may be disposed at a different level or in a different layer from the mesh pattern SS. Thus, even when the strain-sensing pattern SGP-T is disposed to overlap the first sensor pattern SP1 and the second sensor pattern SP2 in a plan view, the strain-sensing pattern SGP-T may be electrically disconnected from the first sensor pattern SP1 and the second sensor pattern SP2.

In such an embodiment, as long as the strain-sensing line SSL-T is electrically disconnected from the first sensor pattern SP1 and the second sensor pattern SP2, the strain-sensing line SSL-T may be disposed on the strain-sensing pattern SGP-T, may be disposed at a same level or in a same layer as the strain-sensing pattern SGP-T, or may be simultaneously formed when the strain-sensing pattern SGP-T is formed. The position and formation of the strain-sensing line SSL-T is not limited thereto.

According to an embodiment of the invention, the strain-sensing pattern SGP-T may be modified to be disposed at various positions. The strain-sensing pattern SGP-T may be disposed at a same level or in a same layer as the touch-sensing layer TSL and may be formed using a process for forming the touch-sensing layer TSL, without forming an additional layer. Thus, the electronic apparatus EA-T may easily or effectively sense not only an external touch but also a folding property.

Figure 12A:
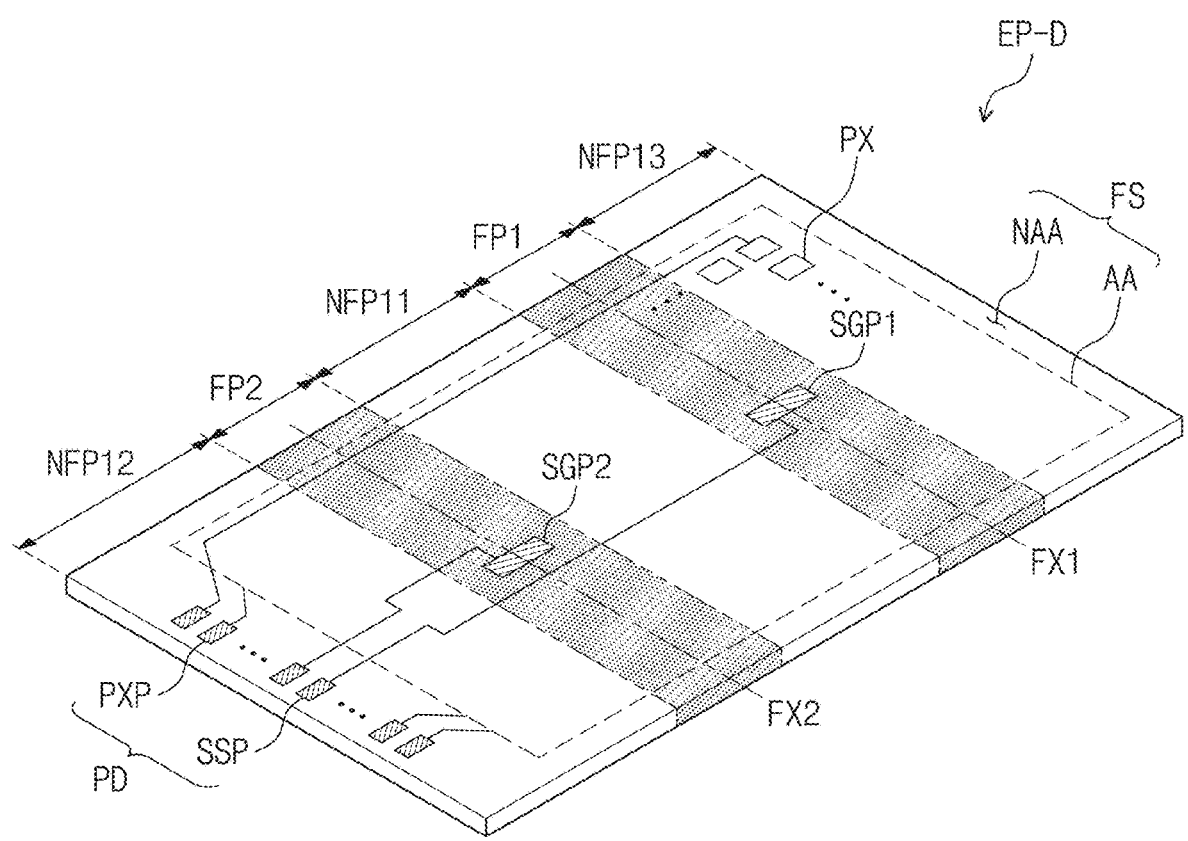
FIGS. 12A and 12B are perspective views illustrating an electronic panel according to an embodiment of the invention.
Figure 12B:
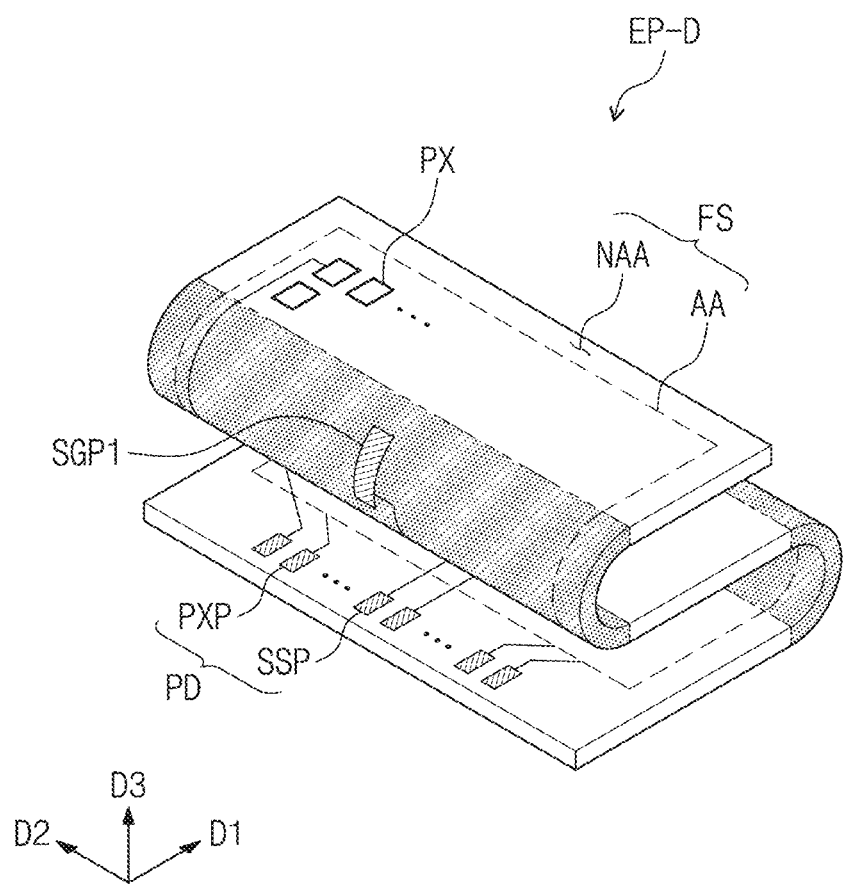
Figure 12C:
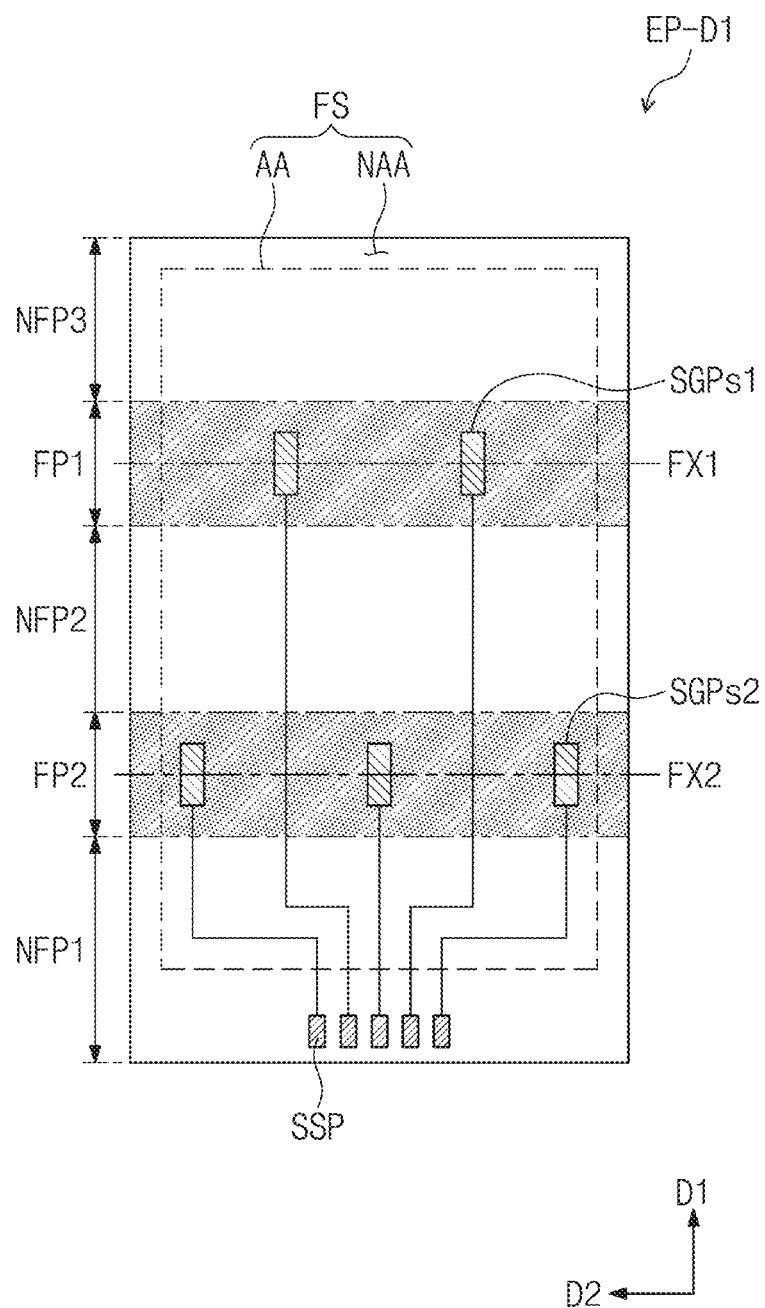
FIG. 12C is a plan view illustrating an electronic panel according to an embodiment of the invention.

FIGS. 12A and 12B are perspective views illustrating an electronic panel according to an embodiment of the invention. FIG. 12C is a plan view illustrating an electronic panel according to an embodiment of the invention. FIG. 12A illustrates an electronic panel EP-D in an unfolded state, and FIG. 12B illustrates the electronic panel EP-D in a folded state. For convenience in illustration, some elements are omitted from FIG. 12C. Hereinafter, an embodiment of the invention will be described with reference to FIGS. 12A to 12C. For concise description, a same or like element previously described with reference to FIGS. 1 to 9B may be identified by the same reference number and any repetitive detailed description thereof will be omitted.

As shown in FIG. 12A, an embodiment of the electronic panel EP-D may be folded along a plurality of folding axes FX1 and FX2. The folding axes FX1 and FX2 may include a first folding axis FX1 and a second folding axis FX2, which extend in the second direction D2 and are spaced apart from each other in the first direction D1.

The electronic panel EP-D may include a first folding part FP1, a second folding part FP2, a first planar part NFP11, a second planar part NFP12, and a third planar part NFP13. The first folding part FP1 may be foldable (or bendable) or configured to be folded along the first folding axis FX1, thereby having a deformable shape. The second folding part FP2 may be foldable or configured to be folded along the second folding axis FX2, thereby having a deformable shape.

The first planar part NFP11 may be disposed between the first folding part FP1 and the second folding part FP2. The second planar part NFP12 may be a region, which is adjacent to the second folding part FP2, and on which a plurality of the pads PD are disposed. The third planar part NFP13 may be adjacent to the first folding part FP1. The second planar part NFP12, the second folding part FP2, the first planar part NFP11, the first folding part FP1, and the third planar part NFP13 may be sequentially arranged in the first direction D1 and may be connected to each other to form the electronic panel EP-D as a single structure.

In such an embodiment, the electronic panel EP-D may include a first strain-sensing pattern SGP1 disposed in the first folding part FP1 and a second strain-sensing pattern SGP2 disposed in the second folding part FP2. The first strain-sensing pattern SGP1 and the second strain-sensing pattern SGP2 may be connected to different ones of the strain-sensing pads SSP to independently sense the folding of the first folding part FP1 and the folding of the second folding part FP2.

In such an embodiment of the electronic panel EP-D, the first folding part FP1 and the second folding part FP2 may be folded in different directions along the folding axes FX1 and FX2, respectively. In one embodiment, for example, as shown in FIG. 12B, the first folding part FP1 may be folded in a way such that the first folding axis FX1 is enclosed by the rear surface of the electronic panel EP-D, and the second folding part FP2 may be folded in a way such that the second folding axis FX2 is enclosed by the front surface FS of the electronic panel EP-D. Accordingly, the third planar part NFP13 may be exposed to the outside, and portions of the active region AA overlapping the second planar part NFP12 and the first planar part NFP11 may not be exposed to the outside. However, the invention is not limited thereto, and in an alternative embodiment, a folding direction of each of the first and second folding parts FP1 and FP2 may be independently controlled or determined.

As shown in FIG. 12C, in an electronic panel EP-D1, a plurality of strain-sensing patterns SGPs1 and SGPs2 may be disposed on each of the first and second folding parts FP1 and FP2. FIG. 12C illustrates an embodiment in which two strain-sensing patterns SGPs1 are disposed on the first folding part FP1 and three strain-sensing patterns SGPs2 are disposed on the second folding part FP2. According to an embodiment of the invention, the numbers, shapes and arrangements of the strain-sensing patterns SGPs1 and SGPs2 disposed on each of the first and second folding parts FP1 and FP2 may be independently and variously modified to easily sense a folding state of each of the first and second folding parts FP1 and FP2.

Figure 13A:
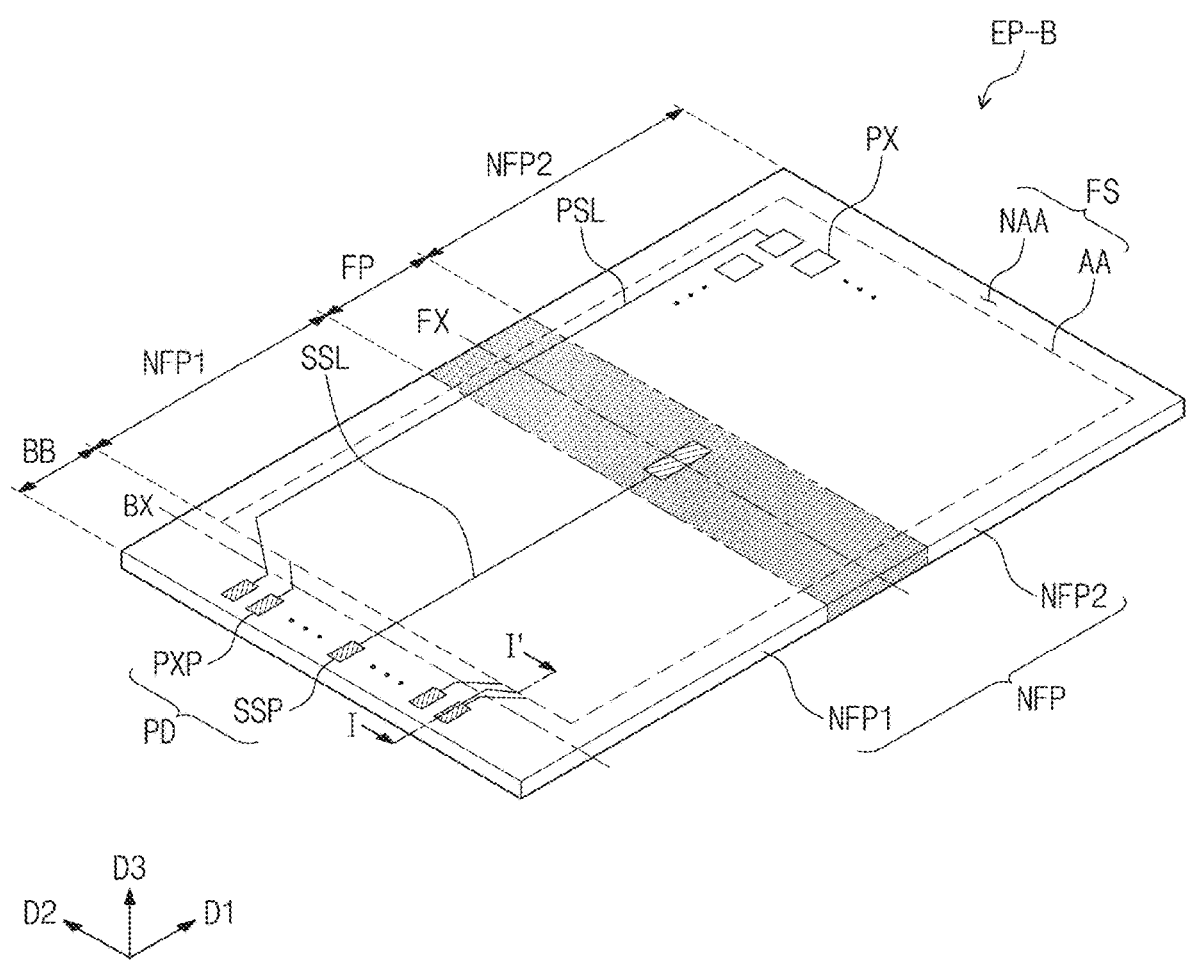
FIGS. 13A and 13B are perspective views illustrating an electronic panel according to an embodiment of the invention.
Figure 13B:
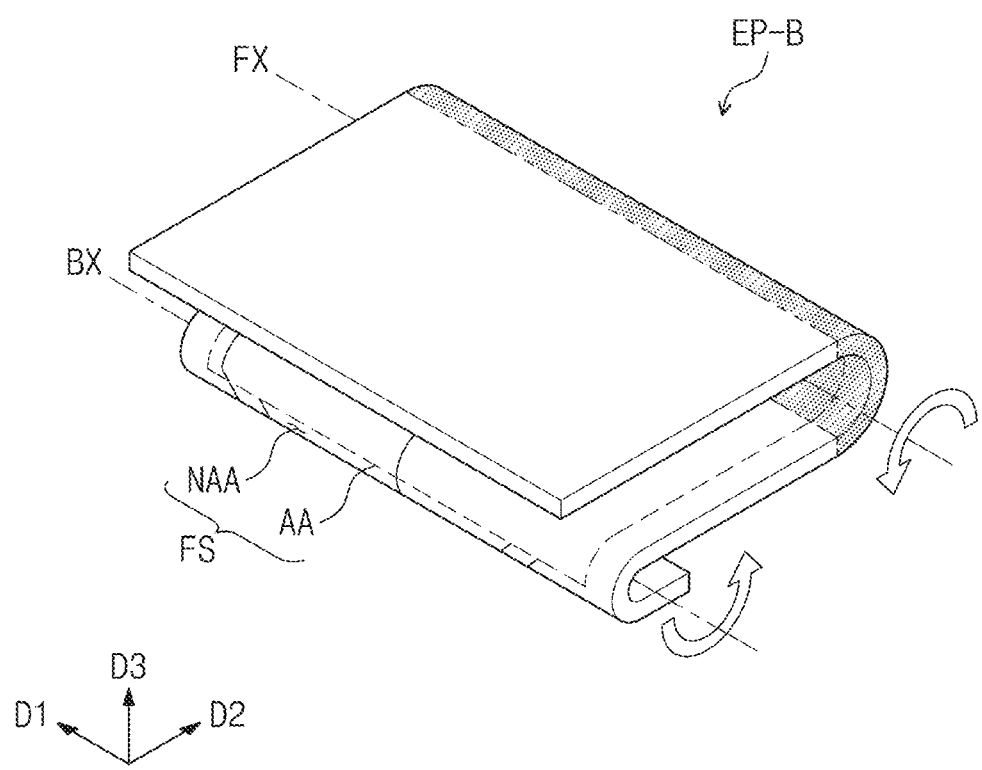
Figure 14A:
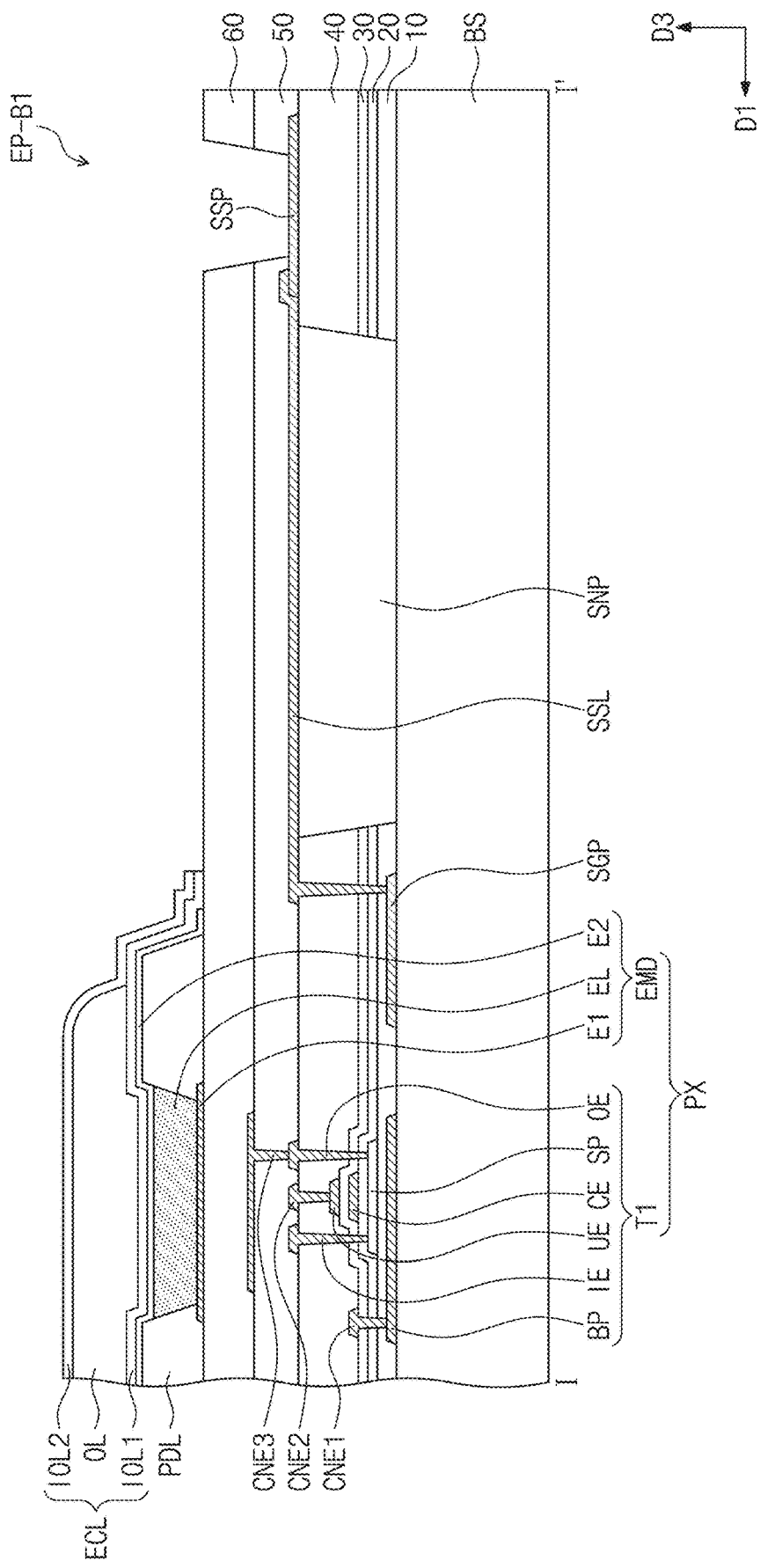
FIGS. 14A and 14B are sectional views each illustrating a portion of an electronic panel according to an embodiment of the invention.
Figure 14B:
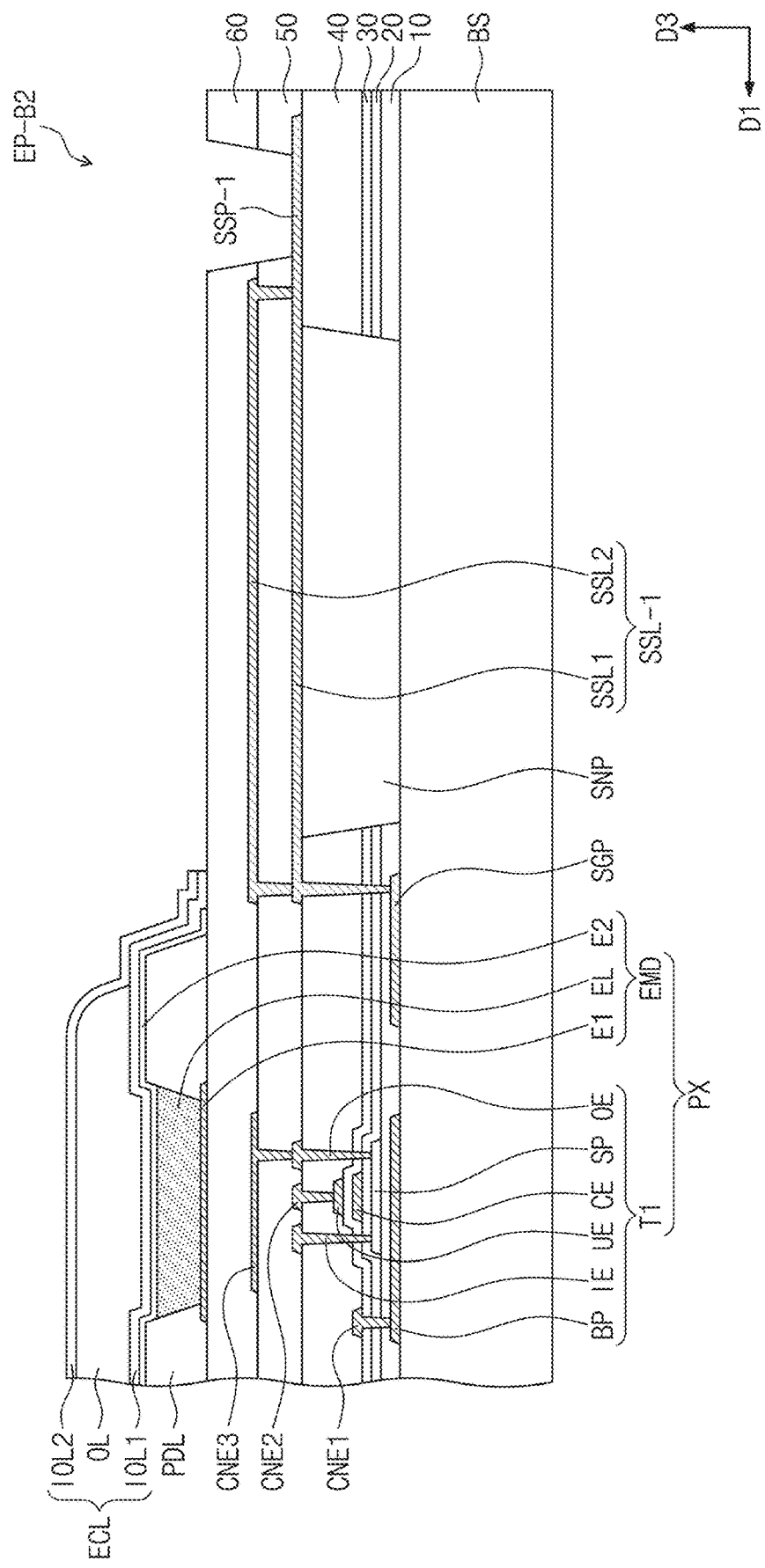

FIGS. 13A and 13B are perspective views illustrating an electronic panel according to an embodiment of the invention. FIGS. 14A and 14B are sectional views each illustrating a portion of an electronic panel according to an embodiment of the invention. FIG. 13A illustrates an electronic panel EP-B1 in an unfolded state, and FIG. 13B illustrates the electronic panel EP-B1 in a folded state. FIG. 14A illustrates a vertical section of the electronic panel EP-B1, taken along line I-I' of FIG. 13A, and FIG. 14B illustrate a vertical section of a portion of the electronic panel EP-B1 corresponding to FIG. 13A. Hereinafter, an embodiment of the invention will be described with reference to FIGS. 13A, 13B, 14A, and 14B. For concise description, a same or like element previously described with reference to FIGS. 1 to 12C may be identified by the same reference number and any repetitive detailed description thereof will be omitted.

As shown in FIGS. 13A and 13B, an embodiment of the electronic panel EP-B may include the folding part FP, the first planar part NFP1, the second planar part NFP2, and a bending part BB. The folding part FP may be a deformable region, which may be folded along the folding axis FX. The bending part BB may be a deformable region, which may be bent along a bending axis BX. The extent of the deformation caused by the bending may be relatively smaller than the extent of the deformation caused by the folding.

The electronic panel EP-B may be folded in a way such that the folding axis FX is enclosed by the front surface FS, and the electronic panel EP-B may be bent in a way such that the bending axis BX is enclosed by the rear surface. In one embodiment, for example, the folding direction of the electronic panel EP-B may be different from the bending direction. However, the invention is not limited thereto, and in an alternative embodiment, the folding direction of the electronic panel EP-B may be the same as the bending direction.

As shown in FIG. 14A, in an embodiment, the strain-sensing pattern SGP and the strain-sensing pad SSP may be disposed at different levels or in different layers from each other. In such an embodiment, the strain-sensing line SSL may be disposed at a different level or in a different layer from the strain-sensing pattern SGP.

In an embodiment, as shown in FIGS. 14A and 14B, the strain-sensing pattern SGP may be disposed at a same level or in a same layer as the light blocking pattern BP. In such an embodiment, the strain-sensing line SSL may be disposed between the fourth insulating layer 40 and the fifth insulating layer 50. The strain-sensing line SSL may penetrate or be disposed through the first to fourth insulating layers 10, 20, 30, and 40 and may be coupled to the strain-sensing pattern SGP.

The strain-sensing pad SSP may be disposed at a same level or in a same layer as the strain-sensing line SSL. In such an embodiment, the strain-sensing pad SSP may be disposed between the fourth insulating layer 40 and the fifth insulating layer 50. The fifth insulating layer 50 and the sixth insulating layer 60 may be partially opened such that the strain-sensing pad SSP is exposed to the outside. The circuit board CB (e.g., see FIG. 1) may be coupled to the strain-sensing pad SSP through the opened space.

In an embodiment, the strain-sensing line SSL may be separately or independently formed by a process different from that for the strain-sensing pad SSP. Thus, a portion of the strain-sensing line SSL may overlap the strain-sensing pad SSP, and in such an embodiment, the strain-sensing line SSL may be in direct contact with the strain-sensing pad SSP at the overlapped region and may be coupled to the strain-sensing pad SSP.

In an embodiment, the electronic panel EP-B1 may further include a stress-relieving pattern SNP. The stress-relieving pattern SNP may be disposed in an open region, which is defined or formed to expose the base substrate BS, and here, the open region may be formed by locally removing the first to fourth insulating layers 10, 20, 30, and 40. The strain-sensing line SSL may be disposed on the stress-relieving pattern SNP. In such an embodiment, a stress-relieving pattern SNP may be disposed on the bending part BB.

The stress-relieving pattern SNP may include a material whose flexibility is higher than those of the first to fourth insulating layers 10, 20, 30, and 40 and may include an organic material. Thus, the bending part BB may be more easily or effectively bent, and a bending stress exerted on the bending part BB may be relieved. According to an embodiment of the invention, since the stress-sensing line SSL is disposed on the stress-relieving pattern SNP, the strain-sensing line SSL may be effectively prevented from being damaged by a bending stress.

Alternatively, as shown in FIG. 14B, the electronic panel EP-B2 may include a strain-sensing line SSL-1 including a plurality of strain-sensing lines SSL1 and SSL2. In such an embodiment, a first sensing line SSL1 of the strain-sensing lines SSL1 and SSL2 may be disposed between the fourth insulating layer 40 and the fifth insulating layer 50 and on the stress-relieving pattern SNP. The first sensing line SSL1 may penetrate or be disposed through the first to fourth insulating layers 10, 20, 30, and 40 and may be coupled to the strain-sensing pattern SGP.

In an embodiment, a strain-sensing pad SSP-1 and the first sensing line SSL1 may form a single object or may be integrally formed as a single unitary and indivisible unit. In such an embodiment, a region of the first sensing line SSL1, which is exposed by the fifth insulating layer 50 and the sixth insulating layer 60, may be defined as the strain-sensing pad SSP-1. According to an embodiment of the invention, the first sensing line SSL1 and the strain-sensing pad SSP-1 may be simultaneously formed, such that the fabrication process may be simplified and the fabrication cost may be reduced.

A second sensing line SSL2 of the strain-sensing lines SSL1 and SSL2 may be disposed between the fifth insulating layer 50 and the sixth insulating layer 60. The second sensing line SSL2 may be disposed through the fifth insulating layer 50 and may be coupled to the first sensing line SSL1.

The first sensing line SSL1 and the second sensing line SSL2 may be disposed in the bending part BB. Thus, even when one of the first sensing line SSL1 and the second sensing line SSL2 is damaged by a bending stress exerted on the bending part BB, the strain-sensing pad SSP-1 and the strain-sensing pattern SGP may be electrically connected to each other through the other of the first sensing line SSL1 and the second sensing line SSL2 such that reliability of the electronic panel may be improved.

According to an embodiment of the invention, where the bending part BB is further provided, a strain-sensing sensor may be designed to have an improved sensing reliability to a bending stress. Thus, a folding state of the electronic panel EP-B1 or EP-B2 may be effectively sensed, even when the electronic panel EP-B1 or EP-B2 is configured to be bendable.

According to an embodiment of the invention, a strain-sensing pattern, which senses a folding state of an electronic panel (e.g., on whether and how much an electronic panel is folded), is disposed or formed at a same level or in the same layer as elements constituting the electronic apparatus. Thus, the strain-sensing pattern may be easily formed in the electronic apparatus, without an additional process of forming the strain-sensing pattern, such that the fabrication process is simplified and the fabrication cost is reduced. In such an embodiment, various user environments may be provided, based on the sensing of the folding state of the electronic panel.

While the inventions have been particularly shown and described with reference to some embodiments thereof, it will be understood by one of ordinary skill in the art that various changes in form and detail may be made therein without departing from the spirit and scope of the invention as defined by the following claims.

What is claimed is:

1. An electronic apparatus, comprising:
a base substrate including a first planar part, a second planar part apart from the first planar part and a folding part, which is connected to a side of the first planar part and a side of the second planar part and is foldable along a folding axis extending in a predetermined direction, wherein the base substrate includes a front surface including an active region and a peripheral region adjacent to the active region, when viewed from a plan view in a thickness thereof;
a plurality of pixels disposed on the front surface and in the active region;
an encapsulation layer including multiple layers of materials covering the pixels to protect the pixels thereunder;
a strain-sensing pattern disposed on the front surface, in the active region, and on the folding part; and
a plurality of pixel pads disposed on the peripheral region,
wherein the strain-sensing pattern is disposed between the base substrate and the encapsulation layer,
wherein the strain-sensing pattern includes a portion extending in a direction perpendicular to the predetermined direction, and
wherein the length of the portion of the strain-sensing pattern extending in a direction perpendicular to the predetermined direction is equal to a width of the folding part in the direction perpendicular to the predetermined direction,
wherein at least one light emitting region of the plurality of pixels overlap the folding part, and the strain-sensing pattern includes a plurality of grid patterns, and each of the grid patterns constituting the strain-sensing pattern have a size and shape enclosing or surrounding the at least one light emitting region, and
wherein light emitting layers of the pixels define a plurality of light-emitting regions spaced apart from each other, when viewed from the plan view.

2. The electronic apparatus of claim 1, wherein each of the pixels comprises:
a plurality of thin film transistors disposed on the base substrate; and
an organic light emitting device disposed on the thin film transistors and connected to a thin film transistor of the thin film transistors, wherein the organic light emitting device comprises a first electrode, a second electrode on the first electrode, and a light emitting layer between the first electrode and the second electrode,
wherein the thin film transistor comprises:
a semiconductor pattern;
a control electrode crossing the semiconductor pattern with an electrical insulation property therebetween;
an input electrode coupled to an end of the semiconductor pattern;
an output electrode spaced apart from the input electrode and coupled to an opposite end of the semiconductor pattern; and
a light blocking pattern spaced apart from the control electrode with the semiconductor pattern interposed therebetween.

3. The electronic apparatus of claim 2, wherein the strain-sensing pattern is disposed in a same layer as the light blocking pattern.

4. The electronic apparatus of claim 3, wherein
the light blocking pattern comprises a conductive material, and
the strain-sensing pattern comprises a same material as the light blocking pattern.

5. The electronic apparatus of claim 4, wherein the light blocking pattern is coupled to the input electrode.

6. The electronic apparatus of claim 4, wherein the light blocking pattern receives a power voltage.

7. The electronic apparatus of claim 2, wherein
the strain-sensing pattern does not overlap the light-emitting regions, when viewed from the plan view.

8. The electronic apparatus of claim 7, wherein
the strain-sensing pattern is provided in plural, and the plurality of strain-sensing pattern have at least two different shapes.

\* \* \* \* \*